United States Patent
Sato

(10) Patent No.: US 9,853,619 B2
(45) Date of Patent: Dec. 26, 2017

(54) ELECTROSTATIC CAPACITANCE ELEMENT AND RESONANCE CIRCUIT

(75) Inventor: Noritaka Sato, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 201 days.

(21) Appl. No.: 14/352,230

(22) PCT Filed: Aug. 21, 2012

(86) PCT No.: PCT/JP2012/071073
§ 371 (c)(1),
(2), (4) Date: Apr. 16, 2014

(87) PCT Pub. No.: WO2013/061677
PCT Pub. Date: May 2, 2013

(65) Prior Publication Data
US 2014/0285944 A1    Sep. 25, 2014

(30) Foreign Application Priority Data

Oct. 24, 2011    (JP) .................................. 2011-232897

(51) Int. Cl.
*H03H 7/01*    (2006.01)
*H01G 4/30*    (2006.01)
(Continued)

(52) U.S. Cl.
CPC ........... *H03H 7/0115* (2013.01); *H01G 4/005* (2013.01); *H01G 4/12* (2013.01); *H01G 4/232* (2013.01);
(Continued)

(58) Field of Classification Search
CPC ......... H03H 2001/0085; H03H 7/0115; H01G 4/30; H01G 4/12
(Continued)

(56) References Cited

U.S. PATENT DOCUMENTS 7,345,558 B2 *    3/2008    Okahashi .................. H03H 7/38
                                                                    333/175
7,542,264 B2 *    6/2009    Oshima .................... H01G 4/232
                                                                    333/185
(Continued)

FOREIGN PATENT DOCUMENTS

JP    A-2002-075780    3/2002
JP    A-2008-004923    1/2008
(Continued)

OTHER PUBLICATIONS

Nov. 27, 2012 International Search Report issued in International Patent Application No. PCT/JP2012/071073.

*Primary Examiner* — Rakesh Patel
(74) *Attorney, Agent, or Firm* — Oliff PLC

(57) ABSTRACT

A capacitance element body is configured by two or more capacitors, the capacitors being formed of a dielectric layer and at least three internal electrodes, the internal electrodes each being laminated via the dielectric layer and arranged to allow a center of gravity of an electrode body forming electrostatic capacitance to be arranged on a straight line in a lamination direction. In the capacitance element body, said two or more capacitors are serially connected in a lamination direction of the internal electrodes. Furthermore, external terminals, each being electrically connected to an electrode body forming electrostatic capacitance, are formed in side surfaces of the capacitance element body.

6 Claims, 20 Drawing Sheets

(51) Int. Cl.

| | |
|---|---|
| *H01G 4/232* | (2006.01) |
| *H03H 5/00* | (2006.01) |
| *H01G 4/005* | (2006.01) |
| *H01G 4/12* | (2006.01) |
| *H01G 7/00* | (2006.01) |
| *H03H 1/00* | (2006.01) |

(52) U.S. Cl.
CPC ............... *H01G 4/30* (2013.01); *H01G 7/00* (2013.01); *H03H 5/00* (2013.01); *H03H 7/0138* (2013.01); *H03H 2001/0085* (2013.01)

(58) Field of Classification Search
USPC .................. 333/4, 5, 175, 185; 361/321.2
See application file for complete search history.

(56) References Cited

U.S. PATENT DOCUMENTS

| | | | |
|---|---|---|---|
| 2007/0025054 A1* | 2/2007 | Tonogai | H01G 4/30 361/303 |
| 2007/0268651 A1 | 11/2007 | Takashima et al. | |
| 2009/0086403 A1 | 4/2009 | Lee et al. | |
| 2011/0279197 A1* | 11/2011 | Kameya | H01P 1/20345 333/185 |

FOREIGN PATENT DOCUMENTS

| | | |
|---|---|---|
| JP | A-2009-088516 | 4/2009 |
| JP | A-2011-119482 | 6/2011 |
| WO | WO 2011/013658 A1 | 2/2011 |

\* cited by examiner

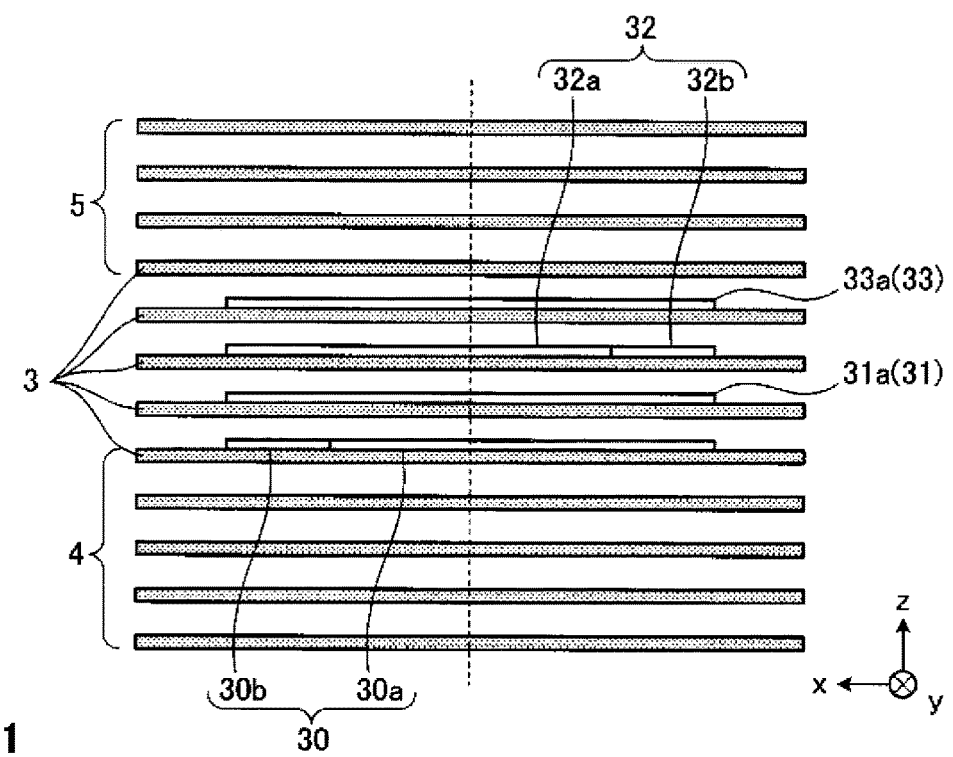
FIG.11
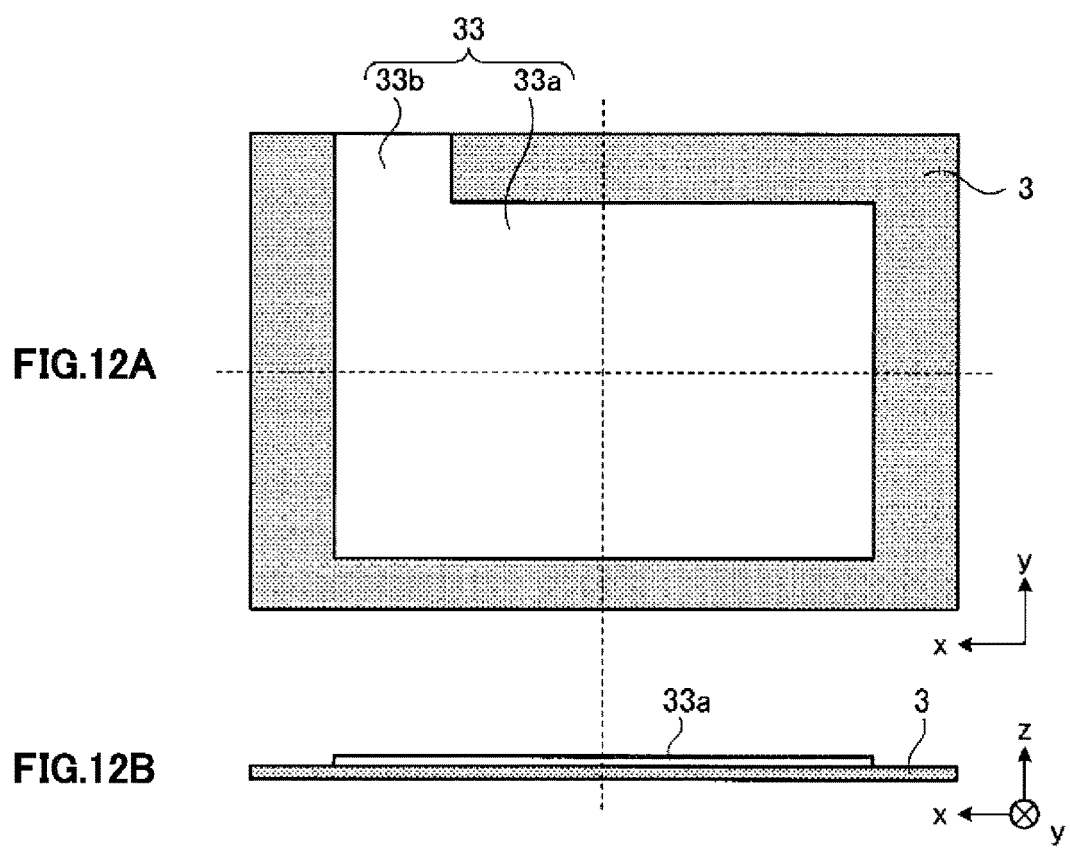
FIG.12A
FIG.12B

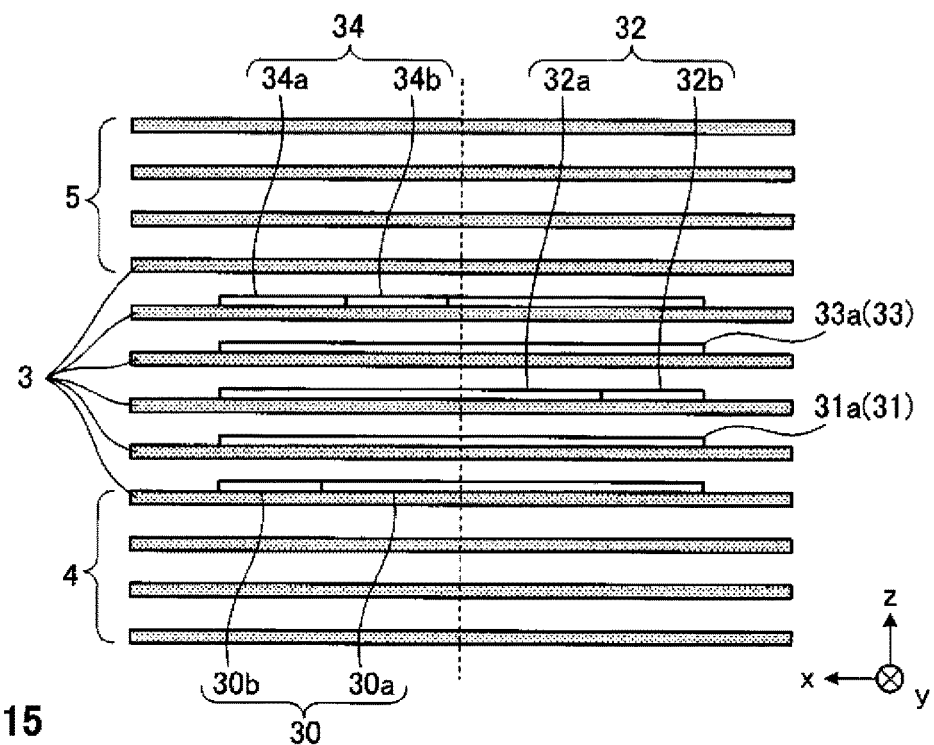
FIG.15
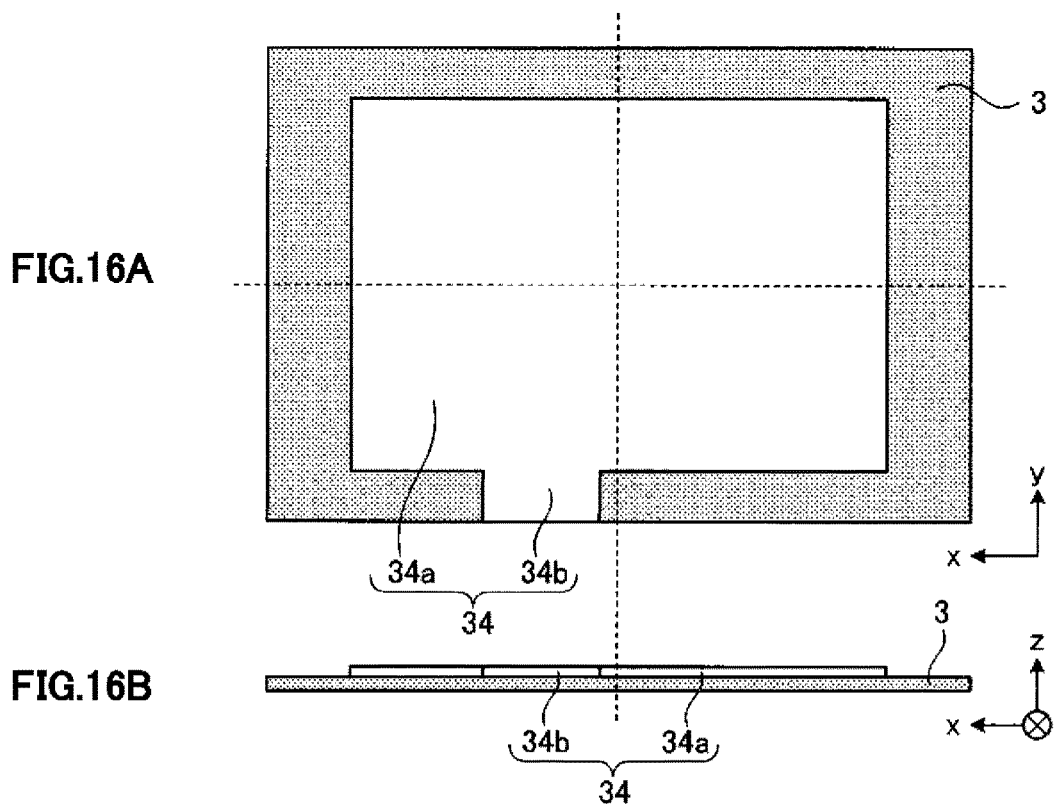
FIG.16A
FIG.16B

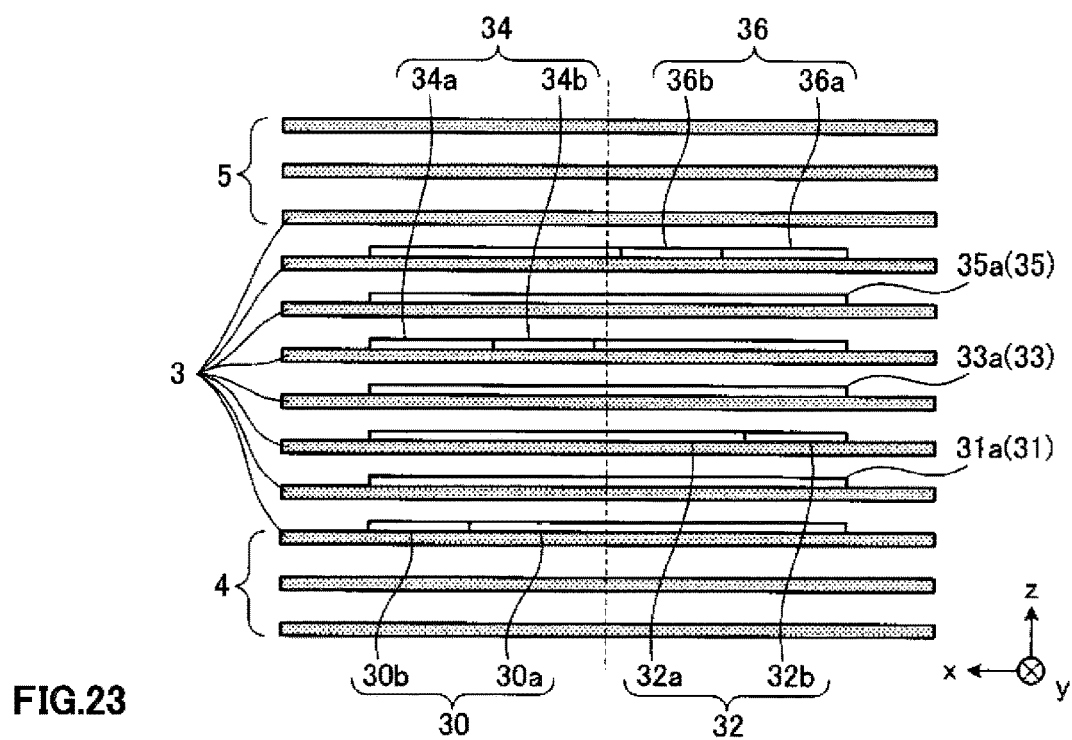
FIG.23
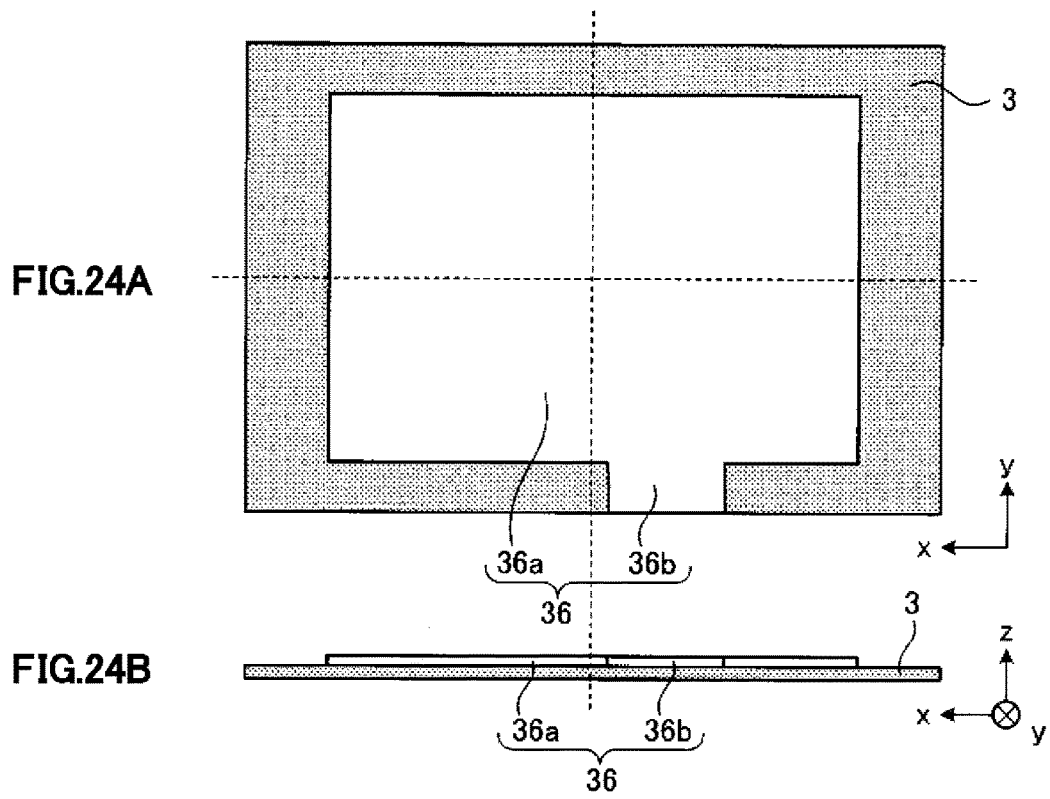
FIG.24A
FIG.24B

ELECTROSTATIC CAPACITANCE ELEMENT AND RESONANCE CIRCUIT

FIELD OF THE INVENTION

The present invention relates to an electrostatic capacitance element, particularly relates to an electrostatic capacitance element comprising a plurality of capacitors which are arranged to be serially connected in a lamination direction of electrodes. Furthermore, the present invention relates to a resonance circuit comprising said electrostatic capacitance element.

BACKGROUND OF THE INVENTION

The present inventors have previously proposed a variable capacitance device comprising a plurality of variable capacitors serially connected in a lamination direction of internal electrodes (Patent Literature 1). An art disclosed in Patent Literature 1 provides a configuration being such that internal electrodes constituting each of the variable capacitors are laminated via a dielectric layer, whereby the number of the internal electrodes per layer can be reduced and a degree of flexibility in designing an electrode, a capacitance value, and the like can be made higher.

On the other hand, the present inventors have proposed another art being such that, in a capacitance element formed by laminating a plurality of internal electrodes, an internal electrode unrelated to a capacitance element body forming electrostatic capacitance is provided as a stress control unit, whereby electrical characteristics are improved with residual stress generated at the time of baking. (Patent Literature 2). According to the art disclosed in Patent Literature 2, the stress control units formed by laminating the internal electrodes are arranged at upper and lower sides of the capacitance element body, whereby internal stress resulting from shrinkage of a dielectric layer at the time of baking of the capacitance element can be generated in the dielectric layer of the capacitance element body. As a result, the dielectric layer of the capacitance element body can have a higher relative dielectric constant.

PRIOR-ART DOCUMENTS

Patent Document

PTL 1: Japanese Patent Application Laid-Open No. 2011-119482
PTL 2: International Publication No. WO 2011/013658

SUMMARY OF THE INVENTION

It should be noted that, also in the variable capacitance device disclosed in Patent Literature 1, internal stress is generated by shrinkage of the dielectric layer at the time of sintering. However, a form of the internal electrode in each layer is determined suitably by capacitance, but determined without consideration of internal stress. Furthermore, Patent Literature 1 has a problem that a change in area of the internal electrodes constituting each of serially-connected variable capacitors causes formation of an electrode portion in which a capacitor is not formed between each of the serially-connected variable capacitors, whereby electrode resistance due to this electrode portion is excessively increased.

In view of the above-mentioned points, the present disclosure aims to improve electrical characteristics of an electrostatic capacitance element comprising a plurality of capacitors serially connected in a lamination direction of electrodes. Furthermore, the present invention aims to provide a resonance circuit excellent in reliability by using the electrostatic capacitance element.

The electrostatic capacitance element according to the present disclosure comprises a capacitance element body and an external terminal. The capacitance element body comprises a dielectric layer, and at least three internal electrodes which are laminated via the dielectric layer and arranged in such a way as to have the centers of gravity of electrode bodies forming electrostatic capacitance arranged on a straight line in a lamination direction. Furthermore, in the capacitance element body, two or more capacitors are formed by these internal electrodes, and said two or more capacitors are serially connected in a lamination direction of the internal electrodes. The external terminal is formed in a side surface of the capacitance element body, and electrically connected to the electrode body forming electrostatic capacitance.

In the electrostatic capacitance element according to the present disclosure, the centers of gravity of the electrode bodies forming electrostatic capacitance are arranged on a straight line in a lamination direction, and therefore, a shrinkage direction of an electrode material or a dielectric material at the time of baking of the capacitance element body is formed toward a straight line on which the centers of gravity are arranged. Thus, residual stress concentrates on the centers of the capacitors formed inside.

The resonance circuit according to the present disclosure comprises a resonance capacitor including the above-mentioned electrostatic capacitance element, and a resonance coil connected to the resonance capacitor.

According to the present disclosure, electrical characteristics of the electrostatic capacitance element comprising a plurality of capacitors which are serially connected in a lamination direction of electrodes can be improved because residual stress generated in a baking treatment at the time of production can be increased.

BRIEF DESCRIPTION OF DRAWINGS

FIG. 11 is an exploded view of a variable capacitance element body according to the second embodiment of the present disclosure, the view being taken from one side surface of the variable capacitance element body in a long side direction.

FIG. 12A is a plane diagram of a fourth electrode, the diagram being obtained when the fourth electrode is seen from an upper surface thereof, and FIG. 12B is a diagram of the fourth electrode, the diagram being obtained when the fourth electrode is seen from one side surface thereof.

FIG. 15 is an exploded view of a variable capacitance element body according to the third embodiment of the present disclosure, the view being taken from one side surface of the variable capacitance element body in a long side direction.

FIG. 16A is a plane diagram of a fifth electrode, the diagram being obtained when the fifth electrode is seen from an upper surface thereof, and FIG. 16B is a diagram of the fifth electrode, the diagram being obtained when the fifth electrode is seen from one side surface thereof.

FIG. 23 is an exploded view of a variable capacitance element body according to the fifth embodiment of the present disclosure, the view being taken from one side surface of the variable capacitance element body in a long side direction.

FIG. 24A is a plane diagram of a seventh electrode, the diagram being obtained when the seventh electrode is seen from an upper surface thereof, and FIG. 24B is a diagram of the seventh electrode, the diagram being obtained when the seventh electrode is seen from one side surface thereof.

DETAILED DESCRIPTION OF THE INVENTION

Figure 1A:
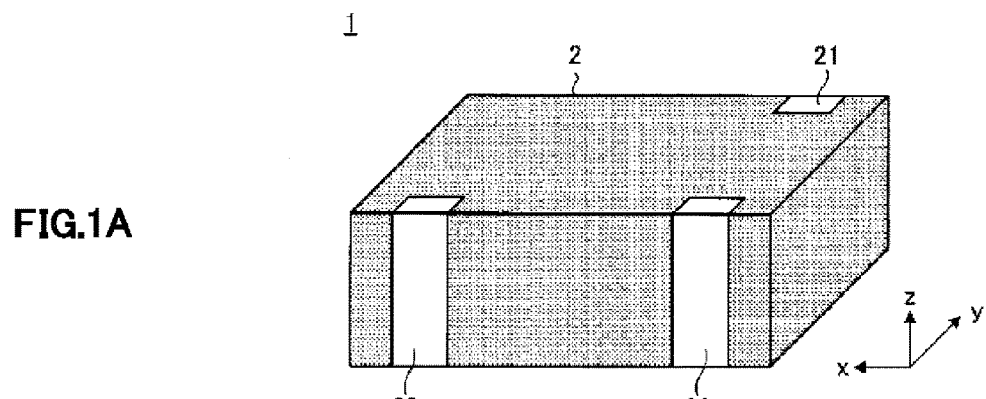
FIG. 1A is a schematic perspective view of a variable capacitance element according to a first embodiment of the present disclosure.

Hereinafter, examples of electrostatic capacitance elements according to the embodiments of the present disclosure and an example of a resonance circuit comprising said electrostatic capacitance element will be explained with reference to the drawings. The embodiments of the present disclosure will be described in the following order. Furthermore, in the embodiments described below, a variable capacitance element, capacitance values of which vary with applied voltage, will be explained as an example. It should be noted that the present disclosure is not limited to the following examples.

1. First Embodiment: an example of a variable capacitance element comprising two serially connected capacitors
   1-1 Configuration of Variable Capacitance Element
   1-2 Producing Method
   1-3 Circuit Configuration
2. Second Embodiment: an example of a variable capacitance element comprising three serially connected capacitors
3. Third Embodiment: an example of a variable capacitance element comprising four serially connected capacitors
4. Fourth Embodiment: an example of a variable capacitance element comprising five serially connected capacitors
5. Fifth Embodiment: an example of a variable capacitance element comprising six serially connected capacitors
6. Sixth Embodiment: an example of a variable capacitance element comprising seven serially connected capacitors
7. Seventh Embodiment: an example of a variable capacitance element comprising parallel connected capacitors and serially connected capacitors
8. Eighth Embodiment: an example of a variable capacitance element comprising parallel-connected and serially-connected capacitors
9. Ninth Embodiment: an example of a variable capacitance element comprising a stress control unit
10. Tenth Embodiment: an example of a resonance circuit to which a variable capacitance element according to the present disclosure is applied 1. First Embodiment

[1-1 Configuration of Variable Capacitance Element]

Figure 1B:
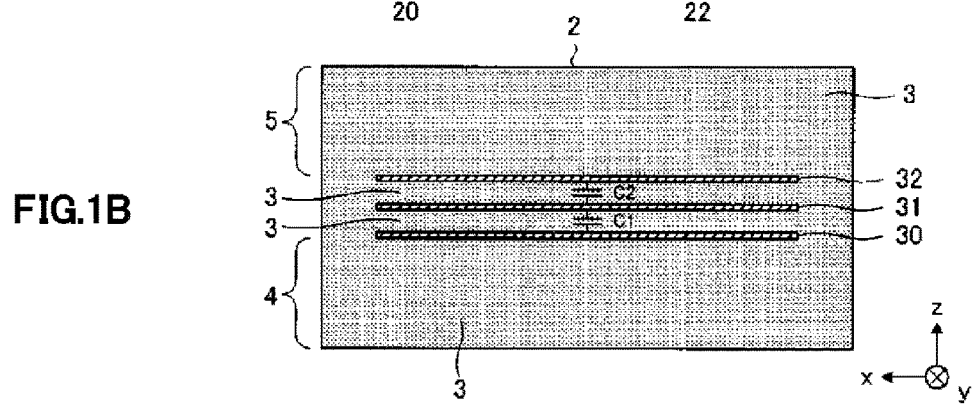
FIG. 1B is a cross-sectional diagram of the variable capacitance element.

FIG. 1A is a schematic perspective view of a variable capacitance element 1 according to the first embodiment of the present disclosure, and FIG. 1B is a cross-sectional diagram of the variable capacitance element 1. In the following explanation, a z direction indicates a lamination direction of internal electrodes mentioned later; an x direction indicates a long side direction of the variable capacitance element 1, the long side direction being at right angles to the lamination direction; and a y direction indicates a short side direction of the variable capacitance element 1, the short side direction being at right angles to the lamination direction. Furthermore, an "upper surface" indicates one surface being in the xy plane of the variable capacitance element 1, and a "lower surface" indicates another surface being in the xy plane thereof. Moreover, a "side surface" indicates a surface perpendicular to the upper surface and the lower surface of the variable capacitance element 1.

As shown in FIG. 1A, the variable capacitance element 1 of the present embodiment example comprises a variable capacitance element body 2 composed of a rectangular parallelepiped member having a rectangular xy plane, and three external terminals (hereinafter, referred to as first external terminal 20 to third external terminal 22, respectively).

The first external terminal 20 and the third external terminal 22 are formed in such a way as to be spaced from each other in one side surface which is in the xz plane and along a long side direction of the variable capacitance element body 2. The second external terminal 21 is formed in another side surface which is in the xz plane and along a long side direction of the variable capacitance element body 2, and arranged in such a way as to be opposed to the first external terminal 20. The first external terminal 20 to the third external terminal 22 have a width in the x direction equivalent to a width of a first connection electrode 30b to the third connection electrode 32b mentioned later, respectively. Furthermore, each of the first external terminal 20 to the third external terminal 22 is formed in such a way as to cover the corresponding one of side surfaces of the variable capacitance element body 2 in the z direction, and also formed in such a way as to project out on the upper and lower surfaces of the variable capacitance element body 2.

As shown in FIG. 1B, the variable capacitance element body 2 comprises a dielectric layer 3 and three internal electrodes laminated via the dielectric layer 3. Hereinafter, for the convenience of explanation, the three internal electrodes are referred to as a first electrode 30 to a third electrode 32, respectively. The variable capacitance element body 2 of the present embodiment example is configured such that the first electrode 30, the second electrode 31, and the third electrode 32 are laminated in this order, a lower dielectric layer 4 is laminated under the first electrode 30, and an upper dielectric layer 5 is laminated over the 3rd electrode 32.

Figure 2:
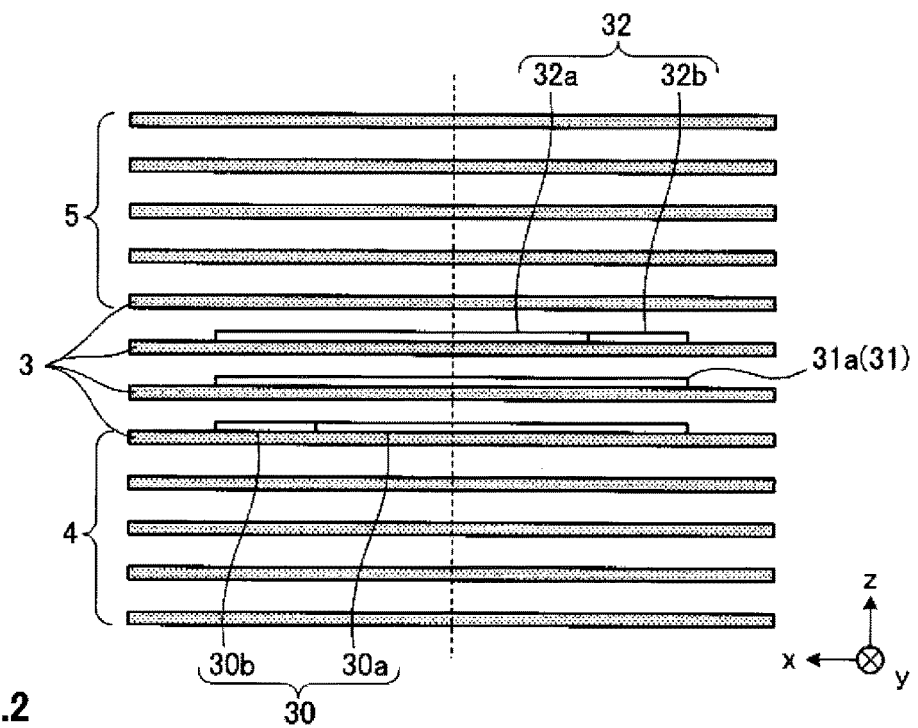
FIG. 2 is an exploded view of a variable capacitance element body according to the first embodiment of the present disclosure, the view being taken from one side surface of the variable capacitance element body along a long side direction.
Figure 3A:
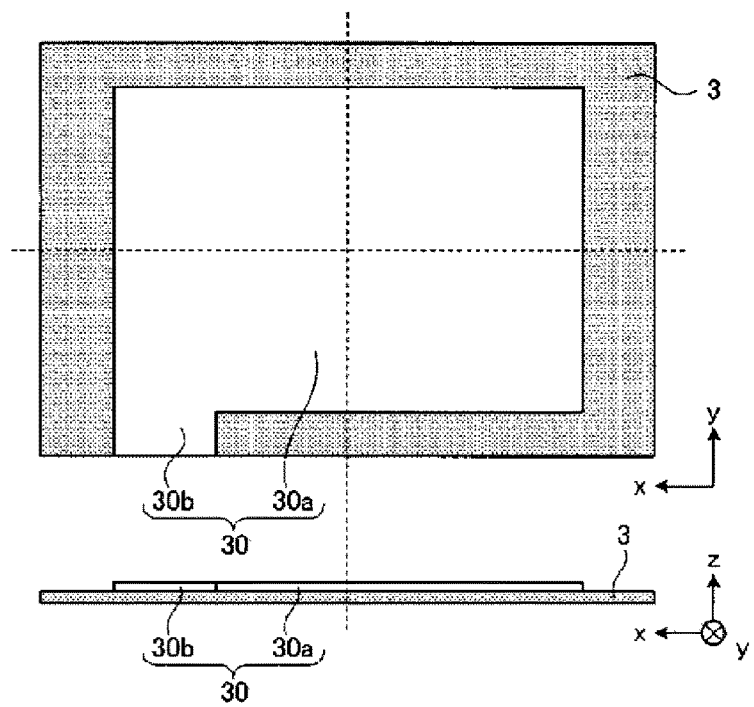
FIG. 3A is a plane diagram of a first electrode, the diagram being obtained when the first electrode is seen from an upper surface thereof.
Figure 3B:
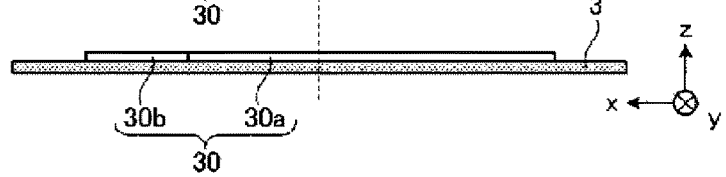
FIG. 3B is a diagram of the first electrode, the diagram being obtained when the first electrode is seen from one side surface thereof.
Figure 4A:
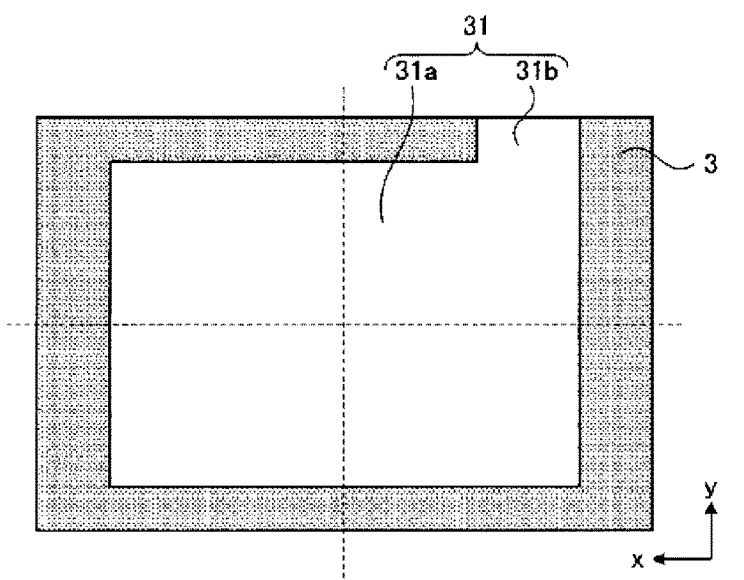
FIG. 4A is a plane diagram of a second electrode, the diagram being obtained when the second electrode is seen from an upper surface thereof.
Figure 4B:
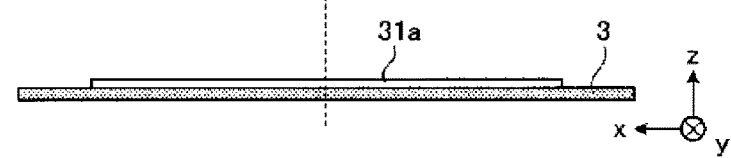
FIG. 4B is a diagram of the second electrode, the diagram being obtained when the second electrode is seen from one side surface thereof.
Figure 5A:
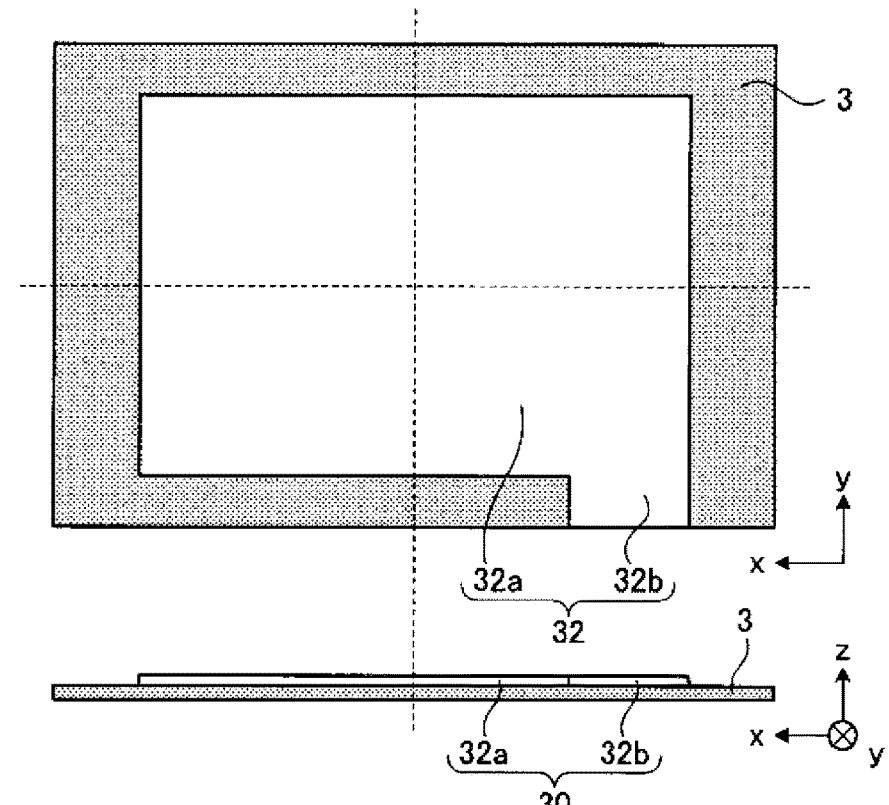
FIG. 5A is a plane diagram of a third electrode, the diagram being obtained when the third electrode is seen from an upper surface thereof.
Figure 5B:
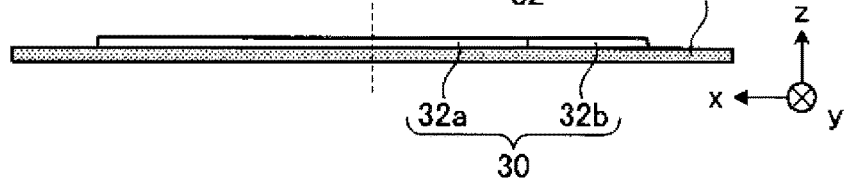
FIG. 5B is a diagram of the third electrode, the diagram being obtained when the third electrode is seen from one side surface thereof.

FIG. 2 is an exploded view of the variable capacitance element body 2, the view being taken from one side surface of the variable capacitance element body 2 along a long side direction thereof. FIG. 3A is a plane diagram of the first electrode 30, the diagram being obtained when the first electrode 30 is seen from an upper surface thereof, and FIG. 3B is a diagram of the first electrode 30, the diagram being obtained when the first electrode 30 is seen from one side surface thereof. FIG. 4A is a plane diagram of the second electrode 31, the diagram being obtained when the second electrode 31 is seen from an upper surface thereof, and FIG. 4B is a diagram of the second electrode 31, the diagram being obtained when the second electrode 31 is seen from one side surface thereof. FIG. 5A is a plane diagram of the third electrode 32, the diagram being obtained when the third electrode 32 is seen from an upper surface thereof, and FIG. 5B is a diagram of the third electrode 32, the diagram being obtained when the third electrode 32 is seen from one side surface thereof. In FIG. 2 to FIG. 5, each of broken lines indicates a line passing through centers (the centers of gravity) of the dielectric layer 3 and each of the internal electrodes.

As shown in FIG. 2, the variable capacitance element body 2 has a structure in which dielectric layers 3 in sheet form, each having an electrode on one surface thereof, are laminated, and in the present embodiment, the variable capacitance element body 2 is configured such that the first electrode 30, the second electrode 31, and the third electrode 32 are laminated from the lower to upper side in this order. Each of the dielectric layers 3 in sheet form has a rectangular plane shape and is configured such that the corresponding one of the electrodes is formed on the rectangular plane thereof.

Furthermore, in the present embodiment example, a plurality of dielectric layers 3 having no electrode formed thereon is provided under the first electrode 30 and another plurality of dielectric layers 3 having no electrode formed thereon is over the third electrode 32, and the plurality of dielectric layers 3 constitute a lower dielectric layer 4 and an upper dielectric layer 5, respectively. The lower dielectric layer 4 and the upper dielectric layer 5, each being composed of the plurality of dielectric layers 3, can prevent an electrode from being exposed on the upper surface or the lower surface of the variable capacitance element body 2.

In the present embodiment example, in order to configure the variable capacitance element 1 whose capacitance varies with applied voltage, the dielectric layer 3 is composed of a ferroelectric material. As such ferroelectric material, specifically, a dielectric material which causes ionic polarization may be used. The ferroelectric material causing ionic polarization is a ferroelectric material composed of an ionic crystal material and causing electrical polarization by displacement of cation and anion atoms. Generally, this ferroelectric material causing ionic polarization is expressed by a chemical formula $ABO_3$ (O represents an oxygen element.), where A and B each represent two predetermined elements, respectively, and has a perovskite structure. Examples of such ferroelectric material include barium titanate ($BaTiO_3$), potassium niobate ($KNbO_3$), and lead titanate ($PbTiO_3$). Moreover, as a material forming the dielectric layer 3, there may be used PZT (lead zirconate titanate), which is obtained by mixing lead zirconate ($PbZrO_3$) with lead titanate ($PbTiO_3$).

Moreover, as the ferroelectric material, a ferroelectric material which causes electronic polarization may be used. This ferroelectric material is divided into a part charged positive and another part charged negative thereby to make an electric dipole moment arise, whereby polarization is brought about. As such material, there has been previously reported a rare earth iron oxide in which polarization is caused by formation of a $Fe^{2+}$ charged surface and a $Fe^{3+}$ charged surface thereby to exhibit ferroelectric characteristics. It has been reported that, in this system, a material expressed by a molecular formula $(RE).(TM)_2.O_4$ (O: oxygen element), where RE represents a rare earth element and TM represents an iron group element, has a higher dielectric constant. It should be noted that examples of the rare earth element include Y, Er, Yb, and Lu (particularly Y and a heavy rare earth element) and examples of the iron group element include Fe, Co, and Ni (particularly Fe). Furthermore, examples of the $(RE).(TM)_2.O_4$ include $ErFe_2O_4$, $LuFe_2O_4$, and $YFe_2O_4$.

As illustrated in FIG. 3A and FIG. 3B, the first electrode 30 comprises a first electrode body 30a and a first connection electrode 30b. The first electrode body 30a has a rectangular plane shape, and is formed in such a way as to have an area smaller than an area of the dielectric layer 3 formed in a sheet shape, in other words, smaller than an area of the xy plane of the variable capacitance element body 2, and as not to be exposed on a side surface of the variable capacitance element body 2. Moreover, the first electrode body 30a is formed in such a way that the center thereof coincides with the center of the dielectric layer 3.

The first connection electrode 30b is formed in such a way as to connect to a side of the first electrode body 30a, the side extending in the x direction, and also as to be exposed on a side surface of the variable capacitance element body 2. Furthermore, the first connection electrode 30b is preferably formed to have such a size that residual stress generated around the first connection electrode 30b at the time of sintering of the variable capacitance element body 2 does not affect residual stress generated at the first electrode body 30a.

It should be noted that the residual stress mentioned here is generated by the difference in shrinkage percentage between an electrode material and a dielectric material in the baking treatment at the time of manufacturing the variable capacitance element body 2. Therefore, in order that residual stress generated around the first connection electrode 30b does not affect residual stress generated in the first electrode body 30a, the first connection electrode 30b is preferably formed in such a way as to have an area sufficiently smaller than an area of the first electrode body 30a. In the present embodiment example, the first connection electrode 30b is formed in such a way as to have a width in the x direction sufficiently smaller than a width of the first electrode body 30a in the x direction.

Furthermore, an end portion of the first connection electrode 30b, the portion being exposed on a side surface of the variable capacitance element body 2, is electrically connected to the first external terminal 20.

Here, in order that the residual stress generated around the first connection electrode 30b does not affect the residual stress generated in the first electrode body 30a, a width of the first connection electrode 30a in the x direction is preferably not more than a quarter of a width of the first electrode body 30a in the x direction.

As illustrated in FIG. 4A and FIG. 4B, the second electrode 31 comprises a second electrode body 31a and a second connection electrode 31b. The second electrode body 31a has the same shape as the first electrode body 30a constituting the first electrode 30 has, and is formed in such a way that the center thereof coincides with the center of the dielectric layer 3.

The second connection electrode 31b is formed in such a way as to connect to a side of the second electrode body 31a, the side extending in the x direction, and also as to be exposed on a side surface of the variable capacitance element body 2. Furthermore, the second connection electrode 31b is preferably formed to have such a size that residual stress generated around the second connection electrode 31b at the time of sintering of the variable capacitance element body 2 does not affect residual stress generated at the first electrode body 31a. Therefore, the second connection electrode 31b is preferably formed in such a way as to have an area sufficiently smaller than an area of the second electrode body 31a, and, in the present embodiment example, the second connection electrode 31b is formed in such a way as to have a width in the x direction sufficiently smaller than a width of the second electrode body 31a in the x direction.

Furthermore, the present embodiment example is configured such that the second electrode 31 is obtained by rotating the first electrode 30 through 180 degrees about an axis of the z direction. In other words, when seen from the xy plane, the second connection electrode 31b is formed in such a way as to be diagonally opposite to the first connection electrode 30b. Moreover, an end portion of the second connection electrode 31b, the portion being exposed on a side surface of the variable capacitance element body 2, is electrically connected to the second external terminal 21.

As shown in FIG. 5A and FIG. 5B, the third electrode 32 comprises a third electrode body 32a and a third connection electrode 32b. The third electrode body 32a has the same shape as the first electrode body 30a and the second electrode body 31a have, and is formed in such a way that the center thereof coincides with the center of the dielectric layer 3.

The third connection electrode 32b is formed in such a way as to connect to a side of the third electrode body 32a, the side extending in the x direction, and also as to be exposed on a side surface of the variable capacitance element body 2. Furthermore, the third connection electrode 32b is preferably formed to have such a size that residual stress generated around the third connection electrode 32b at the time of sintering of the variable capacitance element body 2 does not affect residual stress generated at the third electrode body 32a. Therefore, the third connection electrode 32b is preferably formed in such a way as to have an area sufficiently smaller than an area of the third electrode body 32a, and, in the present embodiment example, the third connection electrode 32b is formed in such a way as to have a width in the x direction sufficiently smaller than a width of the third electrode body 32a in the x direction.

Furthermore, the present embodiment example is configured such that the third electrode 32 is obtained by rotating the first electrode 30 through 180 degrees about an axis of the y direction. In other words, the third connection electrode 32b and the first connection electrode 30b are formed on the same side surface of the variable capacitance element body 2 and formed in such a way as to be spaced from each other in the x direction. Moreover, an end portion of the third connection electrode 32b, the portion being exposed on the side surface of the variable capacitance element body 2, is electrically connected to the third external terminal 22.

The first electrode 30 to the third electrode 32 may be formed by using, for example, a conductive paste containing fine metal powder (Pd, Pd/Ag, Ni, or the like). It should be noted that, in the present embodiment example, the first electrode 30 to the third electrode 32 are formed with the same material. However, the present disclosure is not limited to this, and, for example, according to the usage, the first electrode 30 to the third electrode 32 may be formed with different materials.

According to the above-mentioned configuration, as shown in FIG. 2, the first electrode 30 to the third electrode 32 are laminated in such a way that each side and each center of the first electrode body 30a to the third electrode body 32a which have the same shape and overlap each other in the z direction. This allows centers (the centers of gravity) of the first electrode body 30a to the third electrode body 32a to be arranged on a straight line extending in the z direction. Also, in the present embodiment example, the first electrode body 30a to the third electrode body 32a are formed in such a way that centers thereof overlap the center of the dielectric layer 3. Thus, centers (the centers of gravity) of the first electrode body 30a to the third electrode body 32a are arranged on the z direction axis passing through the center of gravity of the variable capacitance element body 2.

[1-2 Producing Method]

An example of a manufacturing method of the variable capacitance element 1 having the above-mentioned configuration will be explained. First, a dielectric sheet made of a desired dielectric material is prepared. The dielectric sheet composes each of the dielectric layers 3 in the variable capacitance element body 2, and has a thickness of, for example, approximately 2.5 μm. These dielectric sheets may be formed in such a way that a dielectric material in paste form is applied to a PET (polyethylene terephthalate) film until desired thickness is attained. Moreover, there is prepared a mask in which a region corresponding to a formation region of each of the first electrode 30 to the third electrode 32 shown in FIG. 3 to FIG. 5 is opened.

Next, fine metal powder of Pt, Pd, Pd/Ag, Ni, Ni alloy, or the like, for example, is made into a paste to prepare a conductive paste. Then, the conductive paste is applied (silk printing) to one surface of each of the dielectric sheets via each of the masks prepared in the preceding step. Thus, there are prepared the dielectric sheets each of which has the corresponding one of the first electrode 30 to the third electrode 32 formed on one surface thereof. At this time, the dielectric sheet is formed in such a way that the center of the electrode body of each of the electrodes coincides with the center of the corresponding one of the dielectric sheets.

Then, each of the dielectric sheets having the corresponding one of the first electrode 30 to the third electrode 32 formed thereon is laminated in a desired order, with the sides of the dielectric sheets on which the respective electrodes are printed being oriented in the same direction. At this time, the dielectric sheets are laminated in such a way that each side as well as each center of the first electrode body 30a to the third electrode body 32a coincide with each other in the z direction. Furthermore, dielectric sheets having no electrode printed thereon are laminated and pressure-bonded on upper and lower sides of this layered product.

Then, a member resulting from the pressure-bonding is baked at a high temperature in a reducing atmosphere, whereby the dielectric sheets and the respective electrodes made of the conductive paste are unified. Thus, the variable capacitance element body 2 is produced. After that, each of the first external terminal 20 to the third external terminal 22 is attached to the respective predetermined position on a side surface of the variable capacitance element body 2. In the present embodiment example, the variable capacitance element 1 is thus produced.

[1-3 Circuit Configuration]

Figure 6:
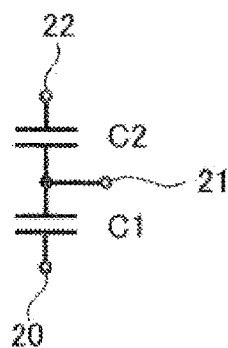
FIG. 6 illustrates an equivalent circuit of the variable capacitance element according to the first embodiment of the present disclosure.

FIG. 6 illustrates an equivalent circuit of the variable capacitance element 1 of the present embodiment example. In the variable capacitance element 1 of the present embodiment example, the first electrode body 30a and the second electrode body 31a are laminated in the z direction, thereby forming a first capacitor C1. Furthermore, the second electrode body 31a and the third electrode body 32a are laminated in the z direction, thereby forming a second capacitor C2. Each of the first electrode 30 to the third electrode 32 is connected to the corresponding one of external terminals (the first external terminal 20 to the third external terminal 22, respectively). Thus, the variable capacitance element 1 of the present embodiment example is configured such that the first capacitor C1 and the second capacitor C2 are serially connected in a lamination direction of the electrodes.

In the variable capacitance element 1 having such a configuration, the capacitance of the first capacitor C1 to the third capacitor C3 can be varied by applying a desired DC voltage on the first external terminal 20 to the third external terminal 22.

It should be noted that, in the variable capacitance element 1 of the present embodiment example, residual stress is generated by the difference in shrinkage percentage between an electrode material and a dielectric material at the time of sintering. This residual stress is generated in a shrinkage direction of the electrode material and the dielectric material in each of the layers. Meanwhile, in the variable capacitance element 1 of the present embodiment example, the first electrode body 30a to the third electrode body 32a constituting the first capacitor C1 and the second capacitor C2 have the same shape, and are laminated in such a way that each side as well as each center thereof coincide with each other in the z direction. Furthermore, each of the first electrode body 30a to the third electrode body 32a is formed in such a way that the center thereof coincides with the center of the dielectric layer 3. Therefore, in the variable capacitance element 1 of the present embodiment example, at the time of baking, each of the electrodes and the dielectric layers is shrunk in an axial direction of the z direction passing through the center of gravity of the variable capacitance element body 2. Thus, at the time of sintering, residual stress can be generated with being concentrated on the centers of the first capacitor C1 and the second capacitor C2.

[1-3 Comparative Embodiment]

Figure 7A:
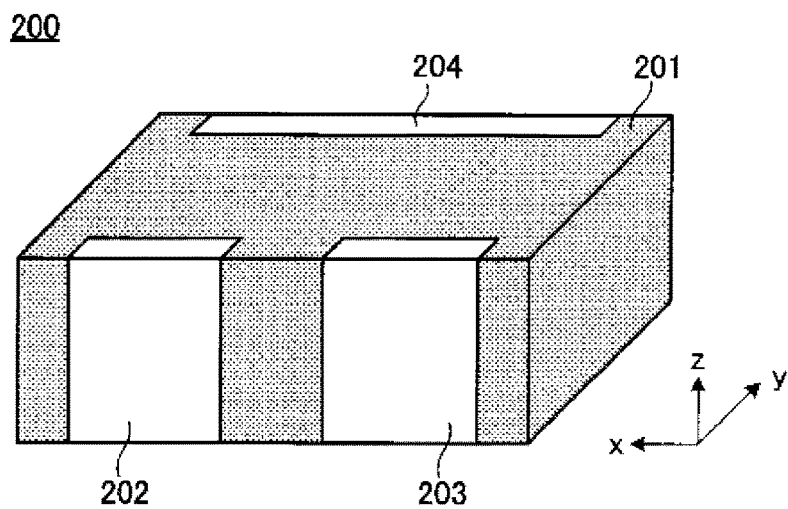
FIG. 7A is an appearance perspective view of the variable capacitance element according to a comparative embodiment.
Figure 7B:
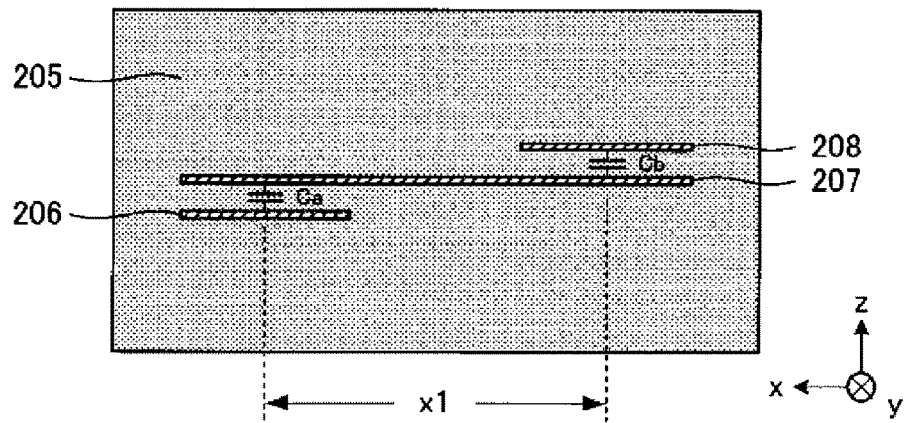
FIG. 7B is a cross-sectional diagram of the variable capacitance element according to the comparative embodiment.

FIG. 7A is an appearance perspective view of a variable capacitance element 200 according to a comparative embodiment, and FIG. 7B is a cross-sectional diagram of the variable capacitance element 200 according to the comparative embodiment. The variable capacitance element 200 according to the comparative embodiment is a variable capacitance element comprising capacitors which are serially connected in a lamination direction of internal electrodes, the variable capacitance element having a configuration which allows an area of each of the internal electrodes to be freely changed, depending on the usage, necessary capacitance, and the like. Also in FIG. 7A and FIG. 7B, a z direction indicates a lamination direction of internal electrodes mentioned later; an x direction indicates a long side direction of the variable capacitance element 200, the long side direction being at right angles to the lamination direction; and a y direction indicates a short side direction of the variable capacitance element 200, the short side direction being at right angles to the lamination direction.

The variable capacitance element 200 according to the comparative embodiment comprises a variable capacitance element body 201 composed of a rectangular parallelepiped member and three external terminals (hereinafter, referred to as a first external terminal 202 to a third external terminal 204, respectively).

The first external terminal 202 and the third external terminal 204 are formed in such a way as to be spaced from each other in one side surface which is in the xz plane and along a long side direction of the variable capacitance element body 201. The second external terminal 203 is formed in another side surface which is in the xz plane and along a long side direction of the variable capacitance element body 201, and formed in such a way as to be opposed to the first external terminal 202.

The variable capacitance element body 201 comprises three internal electrodes (hereinafter, referred to as a first electrode 206 to a third electrode 208) laminated via a dielectric layer 205. The variable capacitance element body 201 according to the comparative example is also configured such that the first electrode 206, the second electrode 207, and the third electrode 208 are laminated in this order.

Figure 8A:
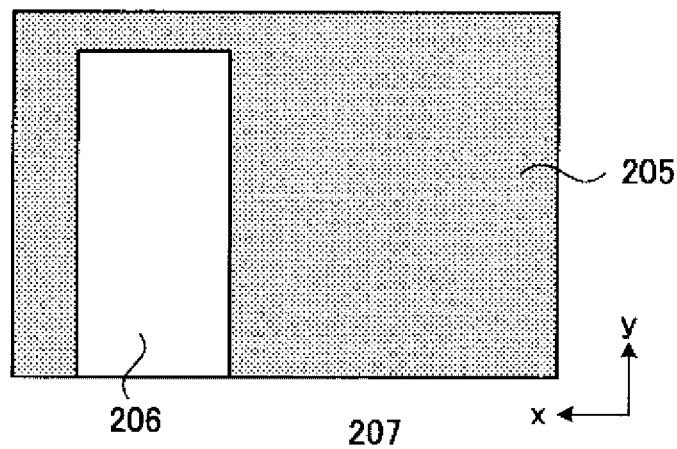
FIG. 8A is a plane diagram of a first electrode in the variable capacitance element according to the comparative embodiment, the diagram being obtained when the first electrode is seen from an upper surface thereof.
Figure 8B:
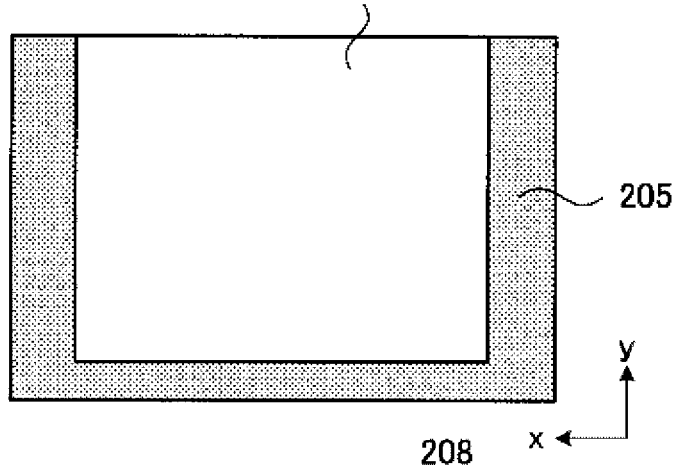
FIG. 8B is a plane diagram of a second electrode in the variable capacitance element according to the comparative embodiment, the diagram being obtained when the second electrode is seen from an upper surface thereof.

FIG. 8A is a plane diagram of the first electrode 206, the diagram being obtained when the first electrode 206 is seen from an upper surface thereof; FIG. 8B is a plane diagram of the second electrode 207, the diagram being obtained when the second electrode 207 is seen from an upper surface thereof; and FIG. 8C is a plane diagram of the third electrode 208, the diagram being obtained when the third electrode 208 is seen from an upper surface thereof.

As shown in FIG. 8A, the first electrode 206 is formed in a rectangular shape and formed in such a way that one end portion thereof is exposed on one side surface in the x direction of the variable capacitance element body 201. Furthermore, the first electrode 206 is electrically connected to the first external terminal 202.

As shown in FIG. 8B, the second electrode 207 is formed in a rectangular shape larger than that of the first electrode 206 and formed in such a way as to partially overlap the first electrode 206 in the z direction. Also, the second electrode 207 is formed in such a way that one end portion thereof is exposed on another side surface in the x direction of the variable capacitance element body 201. Furthermore, the second electrode 207 is electrically connected to the second external terminal 203.

Figure 8C:
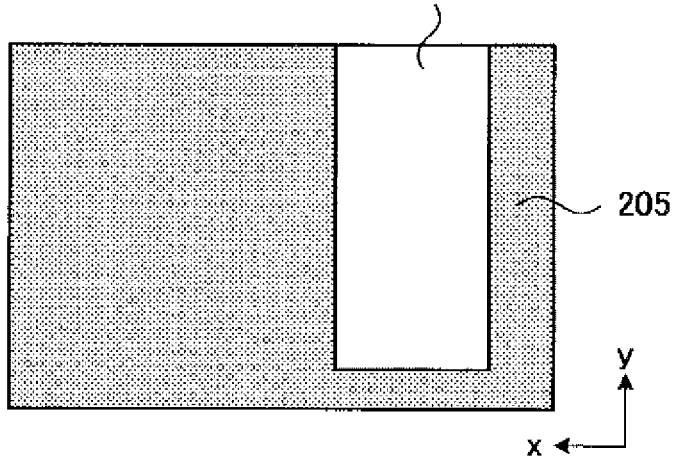
FIG. 8C is a plane diagram of a third electrode in the variable capacitance element according to the comparative embodiment, the diagram being obtained when the third electrode is seen from an upper surface thereof.

As shown in FIG. 8C, the third electrode 208 is formed in a rectangular shape and formed in such a way that one end portion thereof is exposed on one side surface in the x direction of the variable capacitance element body 201. At this time, the third electrode 208 is positioned and formed so as not to overlap the first electrode 206 in the z direction and so as to partially overlap the second electrode 207. Furthermore, the third electrode 208 is electrically connected to the third external terminal 204.

Also in the variable capacitance element 200 according to the comparative example, the first electrode 206 to the third electrode 208 and the dielectric layer 205 are composed of the same electrode material and the same dielectric material as those in the variable capacitance element 1 of the present embodiment example. Furthermore, also in the variable capacitance element 200, each of the first electrode 206 to the third electrode 208 is connected to the corresponding one of external terminals (the first external terminal 202 to the third external terminal 204, respectively). Thus, capacitors serially connected in a lamination direction of the internal electrodes are formed.

Figure 9:
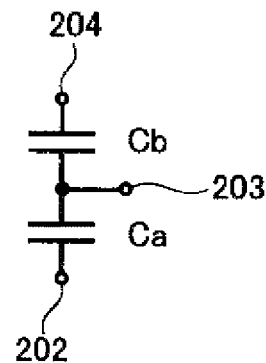
FIG. 9 illustrates an equivalent circuit of the variable capacitance element according to the comparative embodiment.

FIG. 9 illustrates an equivalent circuit of the variable capacitance element 200 according to the comparative embodiment. As shown in FIG. 9, in the comparative example, the first capacitor Ca is formed by the first electrode 206 and the second electrode 207, whereas the second capacitor Cb is formed by the second electrode 207 and the third electrode 208. The variable capacitance element 200 according to the comparative embodiment has a configuration which allows a desired capacitance to be obtained by suitably changing an area of each of the first electrode 206 to the third electrode 208, depending on the usage, necessary capacitance, and the like.

Meanwhile, in the variable capacitance element 200 according to the comparative embodiment, each of the first electrode 206 and the third electrode 208 is formed in such a way as to have an area smaller than that of the second electrode 207 and as to partially overlap the second electrode 207. Therefore, the variable capacitance element 200 having such a configuration causes electrode resistance of a portion indicated with x1 in FIG. 7B to be excessively increased in the equivalent circuit.

Furthermore, in the variable capacitance element 200 according to the comparative embodiment, the first electrode 206 and the third electrode 208 are formed in such a way as to have different areas from each other, and the centers of the electrodes are positioned on different axes in the lamination direction. Therefore, residual stress resulting from shrinkage of the electrode material and the dielectric material at the time of sintering is oriented in various directions inside the variable capacitance element body 201. Accordingly, an effect, such as an increase in electrostatic capacitance owing to residual stress, cannot be obtained.

Compared to this, in the variable capacitance element 1 of the present embodiment example, the first electrode body 30a to the third electrode body 32a constituting the first capacitor C1 and the second capacitor C2 have the same shape, and are laminated in such a way that each side as well as each center thereof coincide with each other in the lamination direction. Therefore, resistance between the capacitors is caused only in a thickness direction of each of the electrode layers, whereby resistance between the adjoining capacitors can be kept to a minimum.

Also, in the present embodiment example, the first electrode body 30a to the third electrode body 32a have the same shape, and are laminated in such a way that each side as well as each center thereof coincide with each other in the z direction. Thus, in the variable capacitance element 1 of the present embodiment example, at the time of sintering, residual stress can be generated with being concentrated on the centers of the first capacitor C1 and the second capacitor C2. As a result, residual stress allows to improve electrical characteristics, such as an increase in electrostatic capacitance and an increase in variable rate of capacitance.

In the variable capacitance element 1 of the present embodiment example, each of the first electrode body 30a to the third electrode body 32a is formed in such a way that the center thereof coincides with the center of the dielectric layer 3. Thus, the center of each of the first electrode body 30a to the third electrode body 32a is positioned on a straight line passing through the center of gravity of the variable capacitance element body 2, which is a layered product formed of the dielectric layer 3 and internal electrodes. Thus, the centers of gravity of the first electrode body 30a to the third electrode body 32a are designed in such a way as to be on a straight line passing through the center of gravity of the variable capacitance element body 2, whereby larger residual stress can be generated.

2. Second Embodiment

Figure 10A:
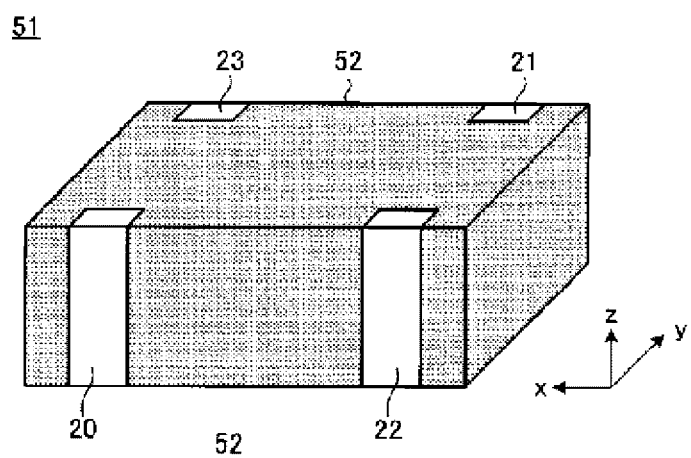
FIG. 10A is a perspective view of a variable capacitance element according to a second embodiment of the present disclosure.
Figure 10B:
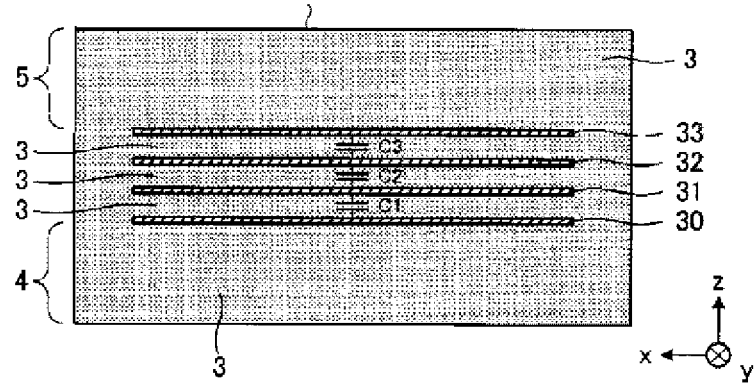
FIG. 10B is a cross-sectional diagram of the variable capacitance element according to the second embodiment of the present disclosure.

Next, a variable capacitance element according to a second embodiment of the present disclosure will be explained. FIG. 10A is a perspective view of a variable capacitance element 51 of to the present embodiment example, and FIG. 10B is a cross-sectional diagram of the variable capacitance element 51 of the present embodiment example. The variable capacitance element 51 of the present embodiment example is configured to further comprise a fourth electrode above the third electrode 32 of the variable capacitance element 1 according to the first embodiment.

In FIG. 10A and FIG. 10B, portions corresponding to portions in FIG. 1A and FIG. 1B are assigned the same reference numerals and letters, and duplicate description thereof will be omitted.

As shown in FIG. 10A, the variable capacitance element 51 of the present embodiment example comprises a variable capacitance element body 52 composed of a rectangular parallelepiped member and four external terminals, that is, the first external terminal 20 to a fourth external terminal 23.

The fourth external terminal 23 is formed in another side surface which is in the xz plane and along a long side direction of the variable capacitance element body 52, and formed in such a way as to be opposed to the first external terminal 20. The fourth external terminal 23 has a width in the x direction equivalent to a width of a fourth connection electrode 33b mentioned later. Furthermore, as are the cases with the first external terminal 20 to the third external terminal 22, the fourth external terminal 23 is formed in such a way as to coat a side surface of the variable capacitance element body 52 in the z direction and also as to project out on the upper and lower surfaces of the variable capacitance element body 52.

FIG. 11 is an exploded view of the variable capacitance element body 52, the view being taken from one side thereof in a long side direction. FIG. 12A is a plane diagram of the fourth electrode 33, the diagram being obtained when the fourth electrode 33 is seen from an upper surface thereof, and FIG. 12B is a diagram of the first electrode 30, the diagram being obtained when the first electrode 30 is seen from one side thereof. In FIG. 11 and FIG. 12, each of broken lines indicates a line passing through the centers (the centers of gravity) of the dielectric layer 3 and each of the internal electrodes.

The variable capacitance element body 52 is configured such that the first electrode 30 to the fourth electrode 33 are laminated in this order via the dielectric layer 3, and the lower dielectric layer 4 is laminated under the first electrode 30 whereas the upper dielectric layer 5 is laminated over the fourth electrode 33.

As shown in FIG. 12A and FIG. 12B, the fourth electrode 33 comprises a fourth electrode body 33a and a fourth connection electrode 33b. The fourth electrode body 33a has the same shape as the first electrode body 30a and the third electrode body 32a have, and is formed in such a way that the center thereof coincides with the center of the dielectric layer 3.

The fourth connection electrode 33b is formed in such a way as to connect to a side of the fourth electrode body 33a, the side extending in the x direction, and also as to be exposed on a side surface of the variable capacitance element body 52. Furthermore, the fourth connection electrode 33b is preferably formed to have such a size that residual stress generated around the fourth connection electrode 33b at the time of sintering of the variable capacitance element body 52 does not affect residual stress generated at the fourth electrode body 33a. Therefore, the fourth connection electrode 33b is preferably formed in such a way as to have an area sufficiently smaller than an area of the fourth electrode body 33a, and, in the present embodiment example, the fourth connection electrode 33b is formed in such a way as to have a width in the x direction sufficiently smaller than a width in the x direction of the fourth electrode body 33a.

Furthermore, the present embodiment example is configured such that the fourth electrode 33 is obtained by rotating the third electrode 32 through 180 degrees about an axis of the z direction. In other words, when seen from the xy plane, the fourth connection electrode 33b is formed in such a way as to be diagonally opposite to the third connection electrode 32b, and furthermore, the fourth connection electrode 33b and the second connection electrode 31b are formed on the same side surface of the variable capacitance element body 52, and formed in such a way as to be spaced from each other in the x direction. Moreover, an end portion of the fourth connection electrode 33b, the portion being exposed on a side surface of the variable capacitance element body 52, is electrically connected to the fourth external terminal 23.

As an electrode material forming the fourth electrode 33, there may be used the same electrode material as those forming the first electrode 30 to the third electrode 32. Moreover, the variable capacitance element 51 of the present embodiment example may be produced by using the same production method as in the first embodiment. Furthermore, in the present embodiment example, the fourth electrode 33 has a shape obtained by rotating the third electrode 32 through 180 degrees about an axis of the z direction. Therefore, using the same mask as in the third electrode 32, the fourth electrode 33 can be formed in a dielectric sheet shape.

Figure 13:
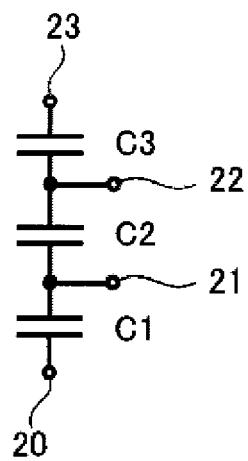
FIG. 13 illustrates an equivalent circuit of the variable capacitance element according to the second embodiment of the present disclosure.

FIG. 13 illustrates an equivalent circuit of the variable capacitance element according to the present embodiment example. In the variable capacitance element 51 of the present embodiment example, the first electrode body 30a and the second electrode body 31a are laminated in the z direction, thereby forming the first capacitor C1. The second electrode body 31a and the third electrode body 32a are laminated in the z direction, thereby forming the second capacitor C2. The third electrode body 32a and the fourth electrode body 33a are laminated in the z direction, thereby forming the third capacitor C3. Furthermore, each of the first electrode 30 to the fourth electrode 33 is connected to the corresponding one of external terminals (the first external terminal 20 to the fourth external terminal 23, respectively). Thus, the variable capacitance element 51 of the present embodiment example is configured such that the first capacitor C1 to the third capacitor C3 are serially connected in a lamination direction of the electrodes.

Also, in the variable capacitance element 51 of the present embodiment example, the first electrode body 30a to the fourth electrode body 33a have the same shape, and are laminated in such a way that each side as well as each center thereof coincide with each other in the z direction. Therefore, the same effect as in the first embodiment can be obtained.

3. Third Embodiment

Figure 14A:
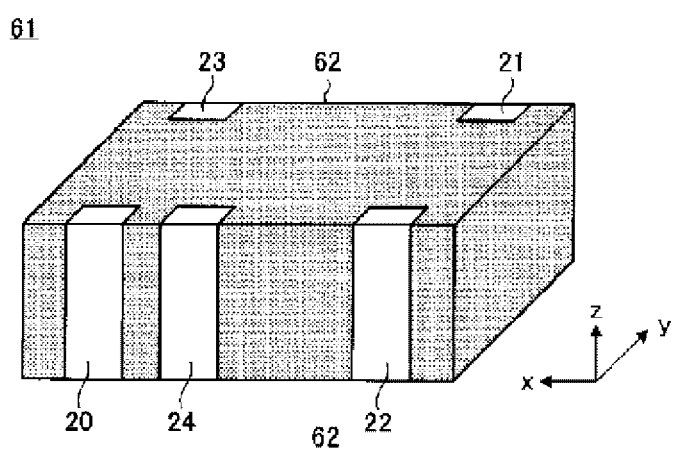
FIG. 14A is a perspective view of a variable capacitance element according to a third embodiment of the present disclosure.
Figure 14B:
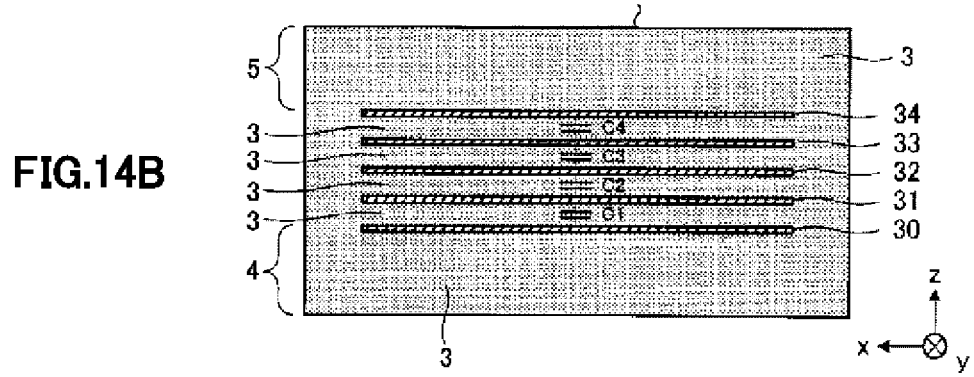
FIG. 14B is a cross-sectional diagram of the variable capacitance element according to the third embodiment of the present disclosure.

Next, a variable capacitance element according to a third embodiment of the present disclosure will be explained. FIG. 14A is a perspective view of a variable capacitance element 61 of the present embodiment example, and FIG. 14B is a cross-sectional diagram of the variable capacitance element 61 of the present embodiment example. The variable capacitance element 61 of the present embodiment example is configured to further comprise a fifth electrode 34 above the fourth electrode 33 of the variable capacitance element 51 according to the second embodiment.

In FIG. 14A and FIG. 14B, portions corresponding to portions in FIG. 10A and FIG. 10B are assigned the same reference numerals and letters, and duplicate description thereof will be omitted.

As shown in FIG. 14A, the variable capacitance element 61 of the present embodiment example comprises a variable capacitance element body 62 composed of a rectangular parallelepiped member and four external terminals, that is, the first external terminal 20 to a fifth external terminal 24.

The fifth external terminal 24 is formed in one side surface which is in the xz plane and along a long side direction of the variable capacitance element body 62, and formed in such a way as to be spaced from the first external terminal 20 and the third external terminal 22. The fifth external terminal 24 has a width in the x direction equivalent to a width of a fifth connection electrode 34b mentioned later. Furthermore, as are the cases with the first external terminal 20 to the fourth external terminal 23, the fifth external terminal 24 is formed in such a way as to coat a side surface of the variable capacitance element body 62 in the z direction and also to project out on the upper and lower surfaces of the variable capacitance element body 62.

FIG. 15 is an exploded view of the variable capacitance element body 62, the view being taken from one side of the variable capacitance element body 62 in a long side direction. FIG. 16A is a plane diagram of the fifth electrode 34, the diagram being obtained when the fifth electrode 34 is seen from an upper surface thereof, and FIG. 16B is a diagram of the fifth electrode 34, the diagram being obtained when the fifth electrode 34 is seen from one side thereof. In FIG. 15 and FIG. 16, each of broken lines indicates a line passing through the centers (the centers of gravity) of the dielectric layer 3 and each of the internal electrodes.

The variable capacitance element body 62 is configured such that the first electrode 30 to the fifth electrode 34 are laminated in this order via the dielectric layer, and the lower dielectric layer 4 is laminated under the first electrode 30 whereas the upper dielectric layer 5 is laminated over the fifth electrode 34.

As shown in FIG. 16A and FIG. 16B, the fifth electrode 34 comprises a fifth electrode body 34a and the fifth connection electrode 34b. The fifth electrode body 34a has the same shape as the first electrode body 30a and the fourth electrode body 33a have, and is formed in such a way that the center thereof coincides with the center of the dielectric layer 3.

The fifth connection electrode 34b is formed in such a way as to connect to a side of the fifth electrode body 34a, the side extending in the x direction, and also as to be exposed on a side surface of the variable capacitance element body 62. Furthermore, the fifth connection electrode 34b is preferably formed to have such a size that residual stress generated around the fifth connection electrode 34b at the time of sintering of the variable capacitance element 61 does not affect residual stress generated at the fifth electrode body 34a. Therefore, the fifth connection electrode 34b is preferably formed in such a way as to have an area sufficiently smaller than an area of the fifth electrode body 34a, and, in the present embodiment example, the fifth connection electrode 34b is formed in such a way as to have a width in the x direction sufficiently smaller than a width in the x direction of the fifth electrode body 34a.

Furthermore, in the present embodiment example, the fifth connection electrode 34b, the first connection electrode 30b, and the third connection electrode 32b are formed on the same side surface of the variable capacitance element body 62, and formed in such a way as to be spaced from each other in the x direction. Moreover, an end portion of the fifth connection electrode 34b, the portion being exposed on a side surface of the variable capacitance element body 62, is electrically connected to the fifth external terminal 24.

As an electrode material forming the fifth electrode 34, there may be used the same electrode material as those forming the first electrode 30 to the fourth electrode 33. Moreover, the variable capacitance element 61 of the present embodiment example may be produced by using the same production method as in the first embodiment.

Figure 17:
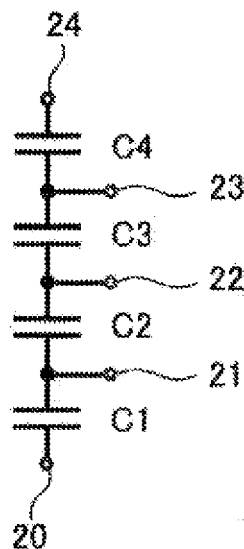
FIG. 17 illustrates an equivalent circuit of the variable capacitance element according to the third embodiment of the present disclosure.

FIG. 17 illustrates an equivalent circuit of the variable capacitance element 61 of the present embodiment example. In the variable capacitance element 61 of the present embodiment example, the first electrode body 30a and the second electrode body 31a are laminated in the z direction, thereby forming the first capacitor C1. The second electrode body 31a and the third electrode body 32a are laminated in the z direction, thereby forming the second capacitor C2. The third electrode body 32a and the fourth electrode body 33a are laminated in the z direction, thereby forming the third capacitor C3. The fourth electrode body 33a and the fifth electrode body 34a are laminated in the z direction, thereby forming the fourth capacitor C4. Furthermore, each of the first electrode 30 to the fifth electrode 34 is connected to the corresponding one of external terminals (the first external terminal 20 to the fifth external terminal 24, respectively). Thus, the variable capacitance element 61 of the present embodiment example is configured such that the first capacitor C1 to the fourth capacitor C4 are serially connected in a lamination direction of the electrodes.

Also, in the variable capacitance element 61 of the present embodiment example, the first electrode body 30a to the fifth electrode body 34a have the same shape, and are laminated in such a way that each side as well as each center thereof coincide with each other in the z direction. Therefore, the same effect as in the first embodiment can be obtained.

4. Fourth Embodiment

Figure 18A:
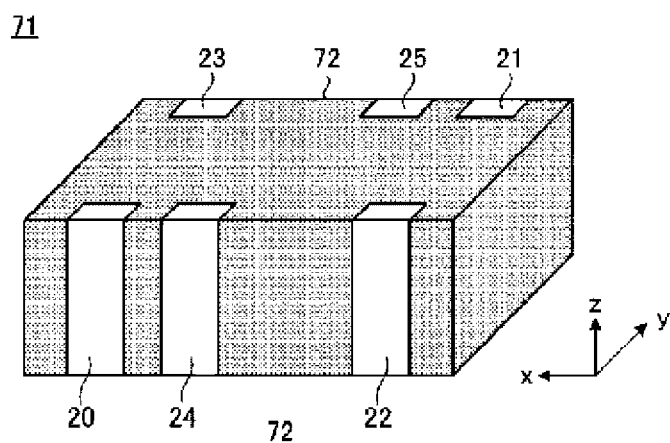
FIG. 18A is a perspective view of a variable capacitance element according to a fourth embodiment of the present disclosure.
Figure 18B:
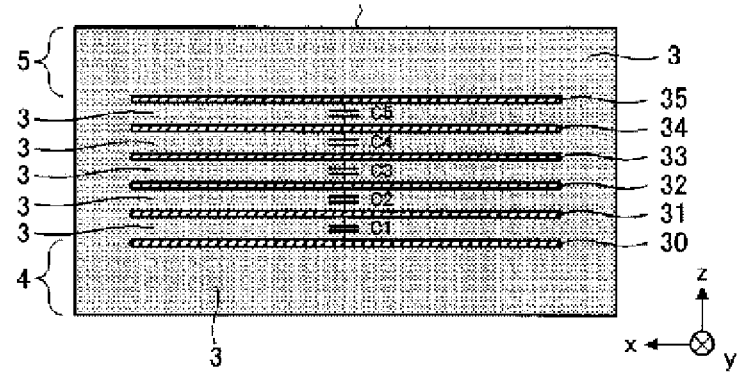
FIG. 18B is a cross-sectional diagram of the variable capacitance element according to the fourth embodiment of the present disclosure.

Next, a variable capacitance element according to a fourth embodiment of the present disclosure will be explained. FIG. 18A is a perspective view of a variable capacitance element 71 of the present embodiment example, and FIG. 18B is a cross-sectional diagram of the variable capacitance element 71 of the present embodiment example. The variable capacitance element 71 of the present embodiment example is configured to further comprise a sixth electrode above the fifth electrode 34 of the variable capacitance element 61 according to the third embodiment.

In FIG. 18A and FIG. 18B, portions corresponding to portions in FIG. 14A and FIG. 14B are assigned the same reference numerals and letters, and duplicate description thereof will be omitted.

As shown in FIG. 18A, the variable capacitance element 71 of the present embodiment example comprises a variable capacitance element body 72 composed of a rectangular parallelepiped member and six external terminals, that is, the first external terminal 20 to a sixth external terminal 25.

The sixth external terminal 25 is formed in another side surface which is in the xz plane and along a long side direction of the variable capacitance element body 72, and formed in such a way as to be spaced from the second external terminal 21 and the fourth external terminal 23. The sixth external terminal 25 has a width in the x direction equivalent to a width of a sixth connection electrode 35b mentioned later. Furthermore, as are the cases with the first external terminal 20 to the fifth external terminal 24, the sixth external terminal 25 is formed in such a way as to coat a side surface of the variable capacitance element body 72 in the z direction and also as to project out on the upper and lower surfaces of the variable capacitance element body 72.

Figure 19:
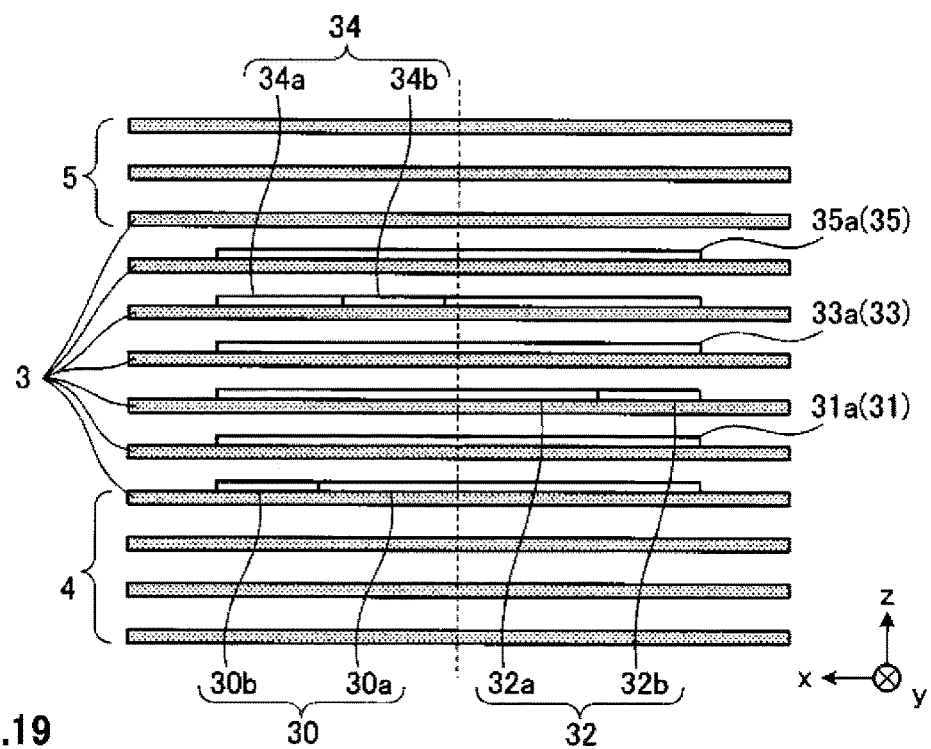
FIG. 19 is an exploded view of a variable capacitance element body according to the fourth embodiment of the present disclosure, the view being taken from one side surface of the variable capacitance element body in a long side direction.
Figure 20A:
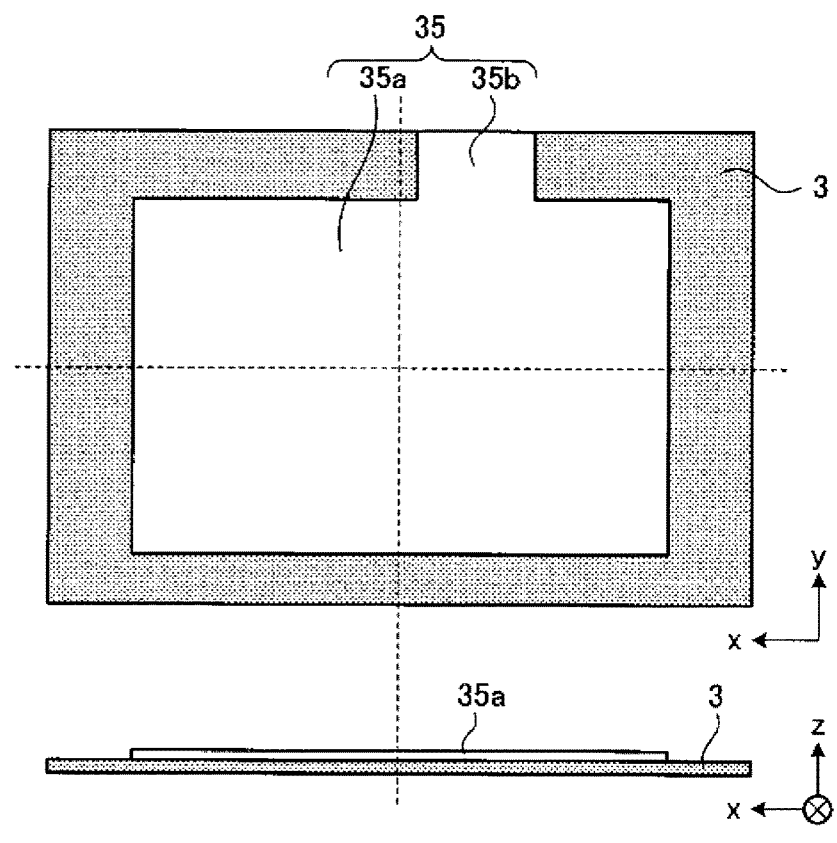
FIG. 20A is a plane diagram of a sixth electrode, the diagram being obtained when the sixth electrode is seen from an upper surface thereof.
Figure 20B:
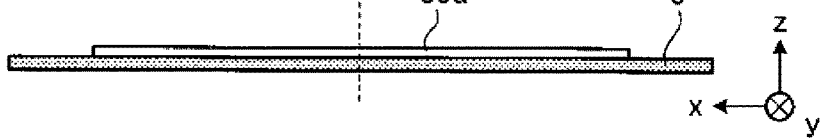
FIG. 20B is a diagram of the sixth electrode, the diagram being obtained when the sixth electrode is seen from one side thereof.

FIG. 19 is an exploded view of the variable capacitance element body 72, the view being taken from one side of the variable capacitance element body 72 in a long side direction. FIG. 20A is a plane diagram of the sixth electrode 35, the diagram being obtained when the sixth electrode 35 is seen from an upper surface thereof, and FIG. 20B is a diagram of the sixth electrode 35, the diagram being obtained when the sixth electrode 35 is seen from one side thereof. In FIG. 19 and FIG. 20, each of broken lines indicates a line passing through the centers (the centers of gravity) of the dielectric layer 3 and each of the internal electrodes.

The variable capacitance element body 72 is configured such that the first electrode 30 to the sixth electrode 35 are laminated in this order via the dielectric layer 3, and the lower dielectric layer 4 is laminated under the first electrode 30 whereas the upper dielectric layer 5 is laminated over the sixth electrode 35.

As shown in FIG. 20A and FIG. 20B, the sixth electrode 35 comprises a sixth electrode body 35a and the sixth connection electrode 35b. The sixth electrode body 35a has the same shape as the first electrode body 30a to the fifth electrode body 34a have, and is formed in such a way that the center thereof coincides with the center of the dielectric layer 3.

The sixth connection electrode 35b is formed in such a way as to connect to a side of the sixth electrode body 35a, the side extending in the x direction, and also as to be exposed on a side surface of the variable capacitance element body 72. Furthermore, the sixth connection electrode 35b is preferably formed to have such a size that residual stress generated around the sixth connection electrode 35b at the time of sintering of the variable capacitance element 72 does not affect residual stress generated at the sixth electrode body 35a. Therefore, the six connection electrode 35b is preferably formed in such a way as to have an area sufficiently smaller than an area of the sixth electrode body 35a, and, in the present embodiment example, the sixth connection electrode 35b is formed in such a way as to have a width in the x direction sufficiently smaller than a width in the x direction of the sixth electrode body 35a.

Furthermore, the present embodiment example is configured such that the sixth electrode 35 is obtained by rotating the fifth electrode 34 through 180 degrees about an axis of the z direction. In other words, when seen from the xy plane, the sixth connection electrode 35b is formed in such a way as to be diagonally opposite to the fifth connection electrode 34b. Furthermore, the six connection electrode 35b, the fourth connection electrode 33b, and the second connection electrode 31b are formed on the same side surface of the variable capacitance element body, and formed in such a way as to be spaced from each other in the x direction. Moreover, an end portion of the sixth connection electrode 35b, the portion being exposed on a side surface of the variable capacitance element body 72, is electrically connected to the sixth external terminal 25.

As an electrode material forming the sixth electrode 35, there may be used the same electrode material as those forming the first electrode 30 to the fifth electrode 34. Moreover, the variable capacitance element 71 of the present embodiment example may be produced by using the same production method as in the first embodiment. Furthermore, in the present embodiment example, the sixth electrode 35 has a shape obtained by rotating the fifth electrode 34 through 180 degrees about an axis of the z direction, and therefore, using the same mask as in the fifth electrode 34, the sixth electrode 35 can be formed in a dielectric sheet shape.

Figure 21:
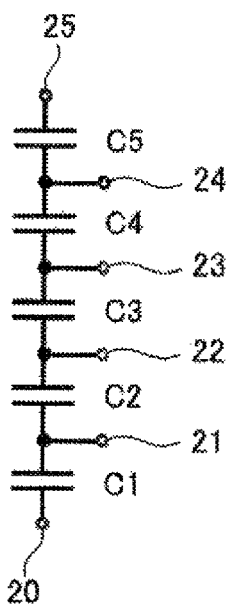
FIG. 21 illustrates an equivalent circuit of the variable capacitance element according to the fourth embodiment of the present disclosure.

FIG. 21 illustrates an equivalent circuit of the variable capacitance element 71 of the present embodiment example. In the variable capacitance element 71 of the present embodiment example, the first electrode body 30a and the second electrode body 31a are laminated in the z direction, thereby forming the first capacitor C1. The second electrode body 31a and the third electrode body 32a are laminated in the z direction, thereby forming the second capacitor C2. The third electrode body 32a and the fourth electrode body 33a are laminated in the z direction, thereby forming the third capacitor C3. The fourth electrode body 33a and the fifth electrode body 34*a* are laminated in the z direction, thereby forming the fourth capacitor C4. The fifth electrode body 34*a* and the sixth electrode body 35*a* are laminated in the z direction, thereby forming the fifth capacitor C5. Furthermore, each of the first electrode 30 to the sixth electrode 35 is connected to the corresponding one of external terminals (the first external terminal 20 to the sixth external terminal 25, respectively). Thus, the variable capacitance element 71 of the present embodiment example is configured such that the first capacitor C1 to the fifth capacitor C5 are serially connected in a lamination direction of the electrodes.

Also, in the variable capacitance element 71 of the present embodiment example, the first electrode body 30*a* to the sixth electrode body 35*a* have the same shape, and are laminated in such a way that each side as well as each center thereof coincide with each other in the z direction. Therefore, the same effect as in the first embodiment can be obtained.

5. Fifth Embodiment

Figure 22A:
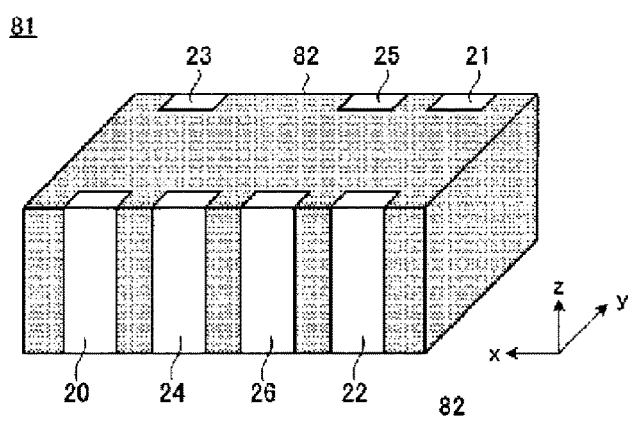
FIG. 22A is a perspective view of a variable capacitance element according to a fifth embodiment of the present disclosure.
Figure 22B:
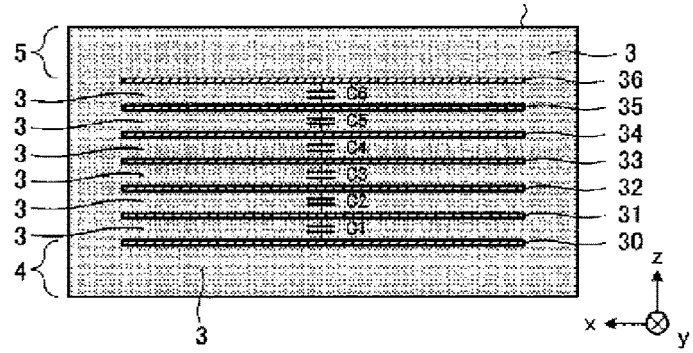
FIG. 22B is a cross-sectional diagram of the variable capacitance element according to the fifth embodiment of the present disclosure.

Next, a variable capacitance element according to a fifth embodiment of the present disclosure will be explained. FIG. 22A is a perspective view of a variable capacitance element 81 of the present embodiment example, and FIG. 22B is a cross-sectional diagram of the variable capacitance element of the present embodiment example. The variable capacitance element of the present embodiment example is configured to further comprise a seventh electrode 36 above the sixth electrode 35 of the variable capacitance element 71 according to the fourth embodiment.

In FIG. 22A and FIG. 22B, portions corresponding to portions in FIG. 18A and FIG. 18B are assigned the same reference numerals and letters, and duplicate description thereof will be omitted.

As shown in FIG. 22A, the variable capacitance element 81 of the present embodiment example comprises a variable capacitance element body 82 composed of a rectangular parallelepiped member and seven external terminals, that is, the first external terminal 20 to a seventh external terminal 26.

The seventh external terminal 26 is formed in one side surface which is in the xz plane and along a long side direction of the variable capacitance element body 82, and formed in such a way as to be spaced from the first external terminal 20, the third external terminal 22, and the fifth external terminal 24. The seventh external terminal 26 has a width in the x direction equivalent to a width of a seventh connection electrode 36*b* mentioned later. Furthermore, as are the cases with the first external terminal 20 to the sixth external terminal 25, the seventh external terminal 26 is formed in such a way as to coat a side surface of the variable capacitance element body 82 in the z direction and also as to project out on the upper and lower surfaces of the variable capacitance element body 82.

FIG. 23 is an exploded view of the variable capacitance element body 82, the view being taken from one side of the variable capacitance element body 82 in a long side direction. FIG. 24A is a plane diagram of the seventh electrode 36, the diagram being obtained when the seventh electrode 36 is seen from an upper surface thereof, and FIG. 24B is a diagram of the seventh electrode 36, the diagram being obtained when the seventh electrode 36 is seen from one side thereof. In FIG. 23 and FIG. 24, each of broken lines indicates a line passing through the centers (the centers of gravity) of the dielectric layer 3 and each of the internal electrodes.

The variable capacitance element body 82 is configured such that the first electrode 30 to the seventh electrode 36 are laminated in this order via the dielectric layer 3, and the lower dielectric layer 4 is laminated under the first electrode 30 whereas the upper dielectric layer 5 is laminated over the seventh electrode 36.

As shown in FIG. 24A and FIG. 24B, the seventh electrode 36 comprises a seventh electrode body 36*a* and the seventh connection electrode 36*b*. The seventh electrode body 36*a* has the same shape as the first electrode body 30*a* to the seventh electrode body 36*a* have, and is formed in such a way that the center thereof coincides with the center of the dielectric layer 3.

The seventh connection electrode 36*b* is formed in such a way as to connect to a side of the seventh electrode body 36*a*, the side extending in the x direction, and also as to be exposed on a side surface of the variable capacitance element body 82. Furthermore, the seventh connection electrode 36*b* is preferably formed to have such a size that residual stress generated around the seventh connection electrode 36*b* at the time of sintering of the variable capacitance element 81 does not affect residual stress generated at the seventh electrode body 36*a*. Therefore, the seventh connection electrode 36*b* is preferably formed in such a way as to have an area sufficiently smaller than an area of the seventh electrode body 36*a*, and, in the present embodiment example, the seventh connection electrode 36*b* is formed in such a way as to have a width in the x direction sufficiently smaller than a width in the x direction of the seventh electrode body 36*a*.

Furthermore, in the present embodiment example, the seventh connection electrode 36*b*, the first connection electrode 30*b*, the third connection electrode 32*b*, and the fifth connection electrode 34*b* are formed on the same side surface of the variable capacitance element body 82, and formed in such a way as to be spaced from each other in the x direction. Moreover, an end portion of the seventh connection electrode 36*b*, the portion being exposed on a side surface of the variable capacitance element body 82, is electrically connected to the seventh external terminal 26.

As an electrode material forming the seventh electrode 36, there may be used the same electrode material as those forming the first electrode 30 to the seventh electrode 36. Moreover, also the variable capacitance element 81 of the present embodiment example may be produced by using the same production method as in the first embodiment.

Figure 25:
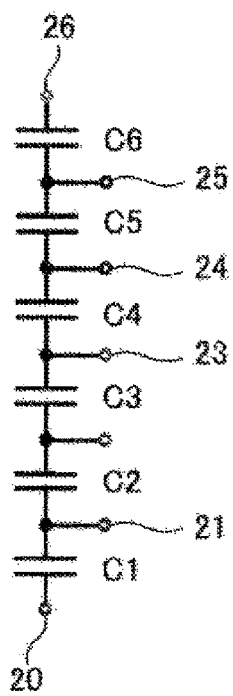
FIG. 25 illustrates an equivalent circuit of the variable capacitance element according to the fifth embodiment of the present disclosure.

FIG. 25 illustrates an equivalent circuit of the variable capacitance element 81 of the present embodiment example. In the variable capacitance element 81 of the present embodiment example, the first electrode body 30*a* and the second electrode body 31*a* are laminated in the z direction, thereby forming the first capacitor C1. The second electrode body 31*a* and the third electrode body 32*a* are laminated in the z direction, thereby forming the second capacitor C2. The third electrode body 32*a* and the fourth electrode body 33*a* are laminated in the z direction, thereby forming the third capacitor C3. The fourth electrode body 33*a* and the fifth electrode body 34*a* are laminated in the z direction, thereby forming the fourth capacitor C4. The fifth electrode body 34*a* and the sixth electrode body 35*a* are laminated in the z direction, thereby forming the fifth capacitor C5. The sixth electrode body 35*a* and the seventh electrode body 36*a* are laminated in the z direction, thereby forming the sixth capacitor C6. Furthermore, each of the first electrode 30 to the seventh electrode 36 is connected to the corresponding one of external terminals (the first external terminal 20 to the seventh external terminal 26, respectively). Thus, the variable capacitance element 81 of the present embodiment example is configured such that the first capacitor C1 to the seventh capacitor C7 are serially connected in a lamination direction of the electrodes.

Also, in the variable capacitance element 81 of the present embodiment example, the first electrode body 30a to the seventh electrode body 36a have the same shape, and are laminated in such a way that each side as well as each center thereof coincide with each other in the z direction. Therefore, the same effect as in the first embodiment can be obtained.

6. Sixth Embodiment

Figure 26A:
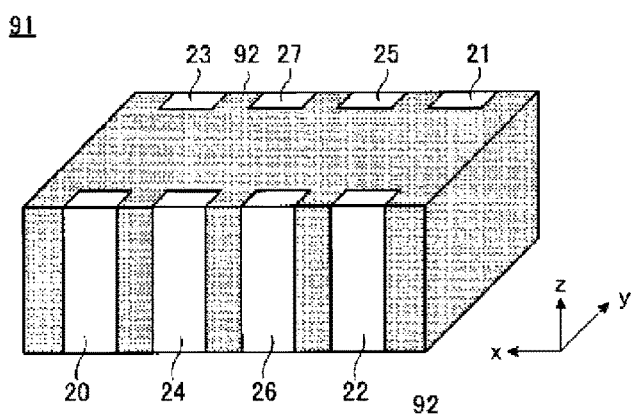
FIG. 26A is a perspective view of a variable capacitance element according to a sixth embodiment of the present disclosure.
Figure 26B:
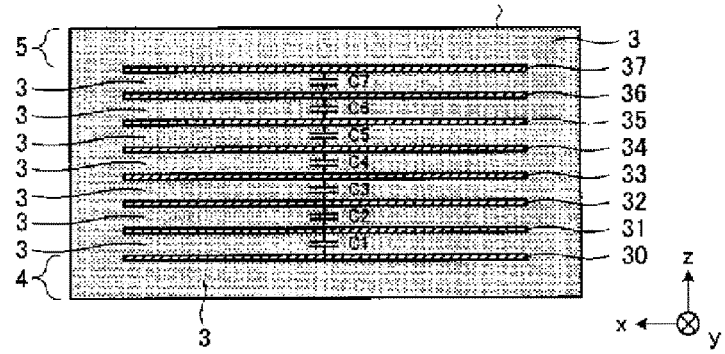
FIG. 26B is a cross-sectional diagram of the variable capacitance element according to the sixth embodiment of the present disclosure.

Next, a variable capacitance element according to a sixth embodiment of the present disclosure will be explained. FIG. 26A is a perspective view of a variable capacitance element 91 of the present embodiment example, and FIG. 26B is a cross-sectional diagram of the variable capacitance element 91 of the present embodiment example. The variable capacitance element 91 of the present embodiment example is configured to further comprise an eighth electrode 37 above the seventh electrode 36 of the variable capacitance element 81 according to the fifth embodiment.

In FIG. 26A and FIG. 26B, portions corresponding to portions in FIG. 22A and FIG. 22B are assigned the same reference numerals and letters, and duplicate description thereof will be omitted.

As shown in FIG. 26A, the variable capacitance element 91 of the present embodiment example comprises a variable capacitance element body 92 composed of a rectangular parallelepiped member and eight external terminals, that is, the first external terminal 20 to an eighth external terminal 27.

The eighth external terminal 27 is formed in another side surface which is in the xz plane and along a long side direction of the variable capacitance element body 92, and formed in such a way as to be spaced from the second external terminal 21, the fourth external terminal 23, and the sixth external terminal 25. The eighth external terminal 27 has a width in the x direction equivalent to a width of an eighth connection electrode 37b mentioned later. Furthermore, as are the cases with the first external terminal 20 to the seventh external terminal 26, the eighth external terminal 27 is formed in such a way as to coat a side surface of the variable capacitance element body 92 in the z direction and also to project out on the upper and lower surfaces of the variable capacitance element body 92.

Figure 27:
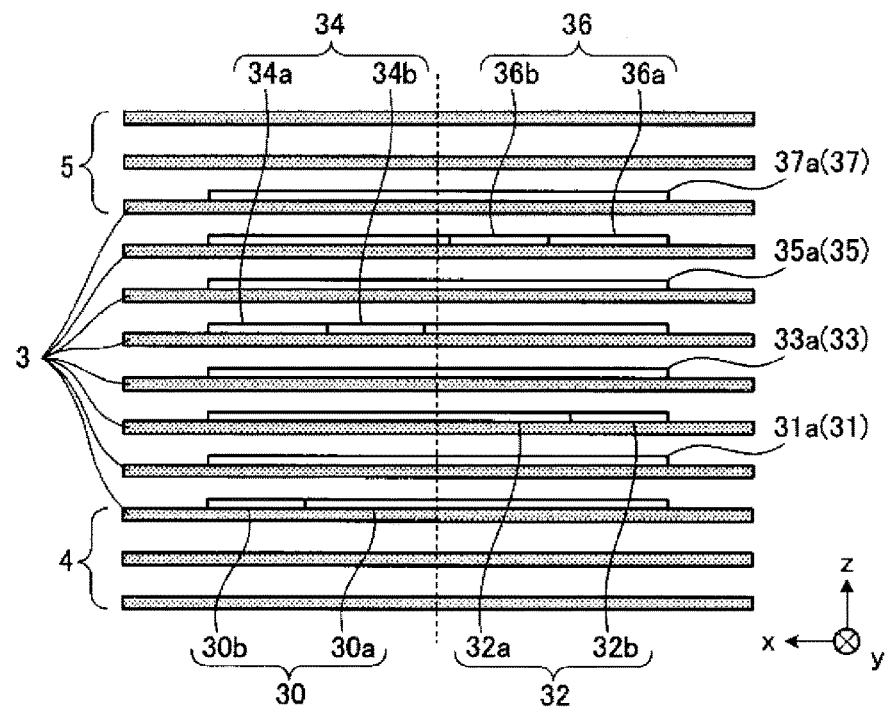
FIG. 27 is an exploded view of a variable capacitance element body according to the sixth embodiment of the present disclosure, the view being taken from one side surface of the variable capacitance element body in a long side direction.
Figure 28A:
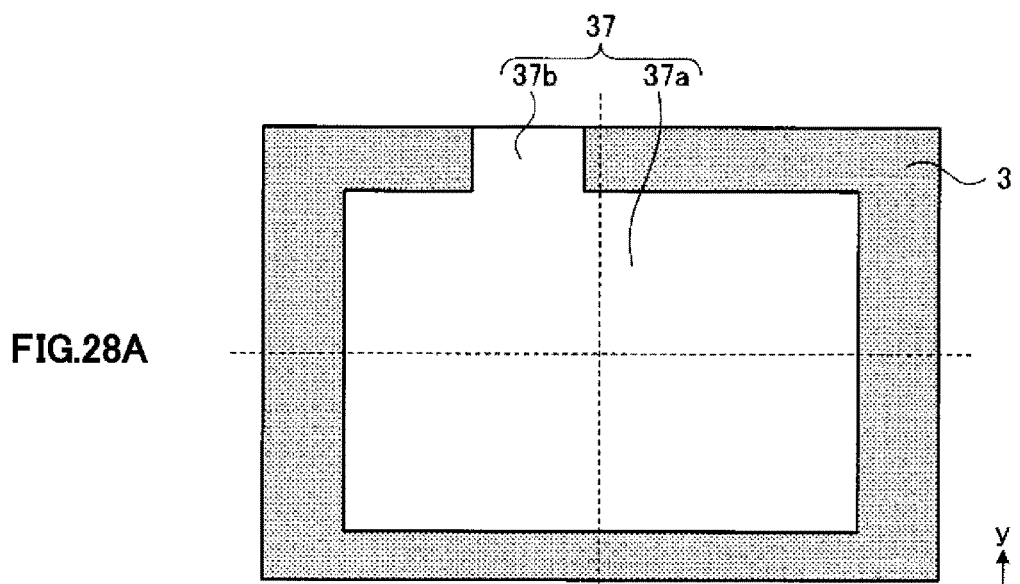
FIG. 28A is a plane diagram of an eighth electrode, the diagram being obtained when the eighth electrode is seen from an upper surface thereof.
Figure 28B:
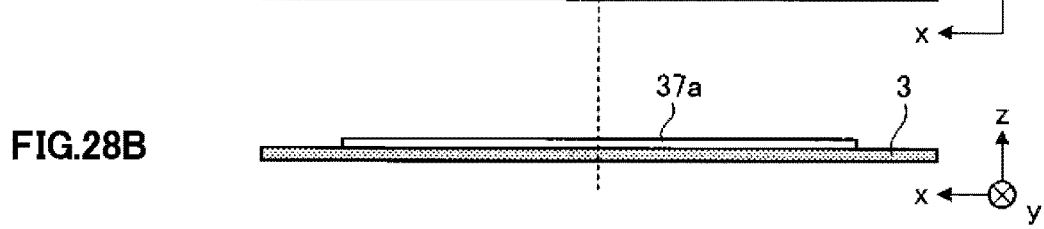
FIG. 28B is a diagram of the eighth electrode, the diagram being obtained when the eighth electrode is seen from one side surface thereof.

FIG. 27 is an exploded view of the variable capacitance element body 92, the view being taken from one side of the variable capacitance element body 92 in a long side direction. FIG. 28A is a plane diagram of the eighth electrode 37, the diagram being obtained when the eighth electrode 37 is seen from an upper surface thereof, and FIG. 28B is a diagram of the eighth electrode 37, the diagram being obtained when the eighth electrode 37 is seen from one side thereof. In FIG. 27 and FIG. 28, each of broken lines indicates a line passing through the centers (the centers of gravity) of the dielectric layer 3 and each of the internal electrodes.

The variable capacitance element body 92 is configured such that the first electrode 30 to the eighth electrode 37 are laminated in this order via the dielectric layer 3, and the lower dielectric layer 4 is laminated under the first electrode 30 whereas the upper dielectric layer 5 is laminated over the eighth electrode 37.

As shown in FIG. 28A and FIG. 28B, the eighth electrode 37 comprises an eighth electrode body 37a and the eighth connection electrode 37b. The eighth electrode body 38a has the same shape as the first electrode body 30a to the eighth electrode body 37a have, and is formed in such a way that the center thereof coincides with the center of the dielectric layer 3.

The eighth connection electrode 37b is formed so as to connect to a side of the eighth electrode body 37a, the side extending in the x direction, and also as to be exposed on a side surface of the variable capacitance element body 92. Furthermore, the eighth connection electrode 37b is preferably formed to have such a size that residual stress generated around the eighth connection electrode 37b at the time of sintering of the variable capacitance element 92 does not affect residual stress generated at the eighth electrode body 37a. Therefore, the eighth connection electrode 37b is preferably formed in such a way to have an area sufficiently smaller than an area of the eighth electrode body 37a, and, in the present embodiment example, the eighth connection electrode 37b is formed in such a way to have a width in the x direction sufficiently smaller than a width in the x direction of the eighth electrode body 37a.

Furthermore, the present embodiment example is configured such that the eighth electrode 37 is obtained by rotating the seventh electrode 36 through 180 degrees about an axis of the z direction. In other words, when seen from the xy plane, the eighth connection electrode 38b is formed in such a way as to be diagonally opposite to the seventh connection electrode 36b. Furthermore, the eighth connection electrode 37b, the sixth connection electrode 35b, the fourth connection electrode 33b, and the second connection electrode 31b are formed on the same side surface of the variable capacitance element body 92, and formed in such a way as to be spaced from each other in the x direction. Moreover, an end portion of the eighth connection electrode 37b, the portion being exposed on a side surface of the variable capacitance element body 92, is electrically connected to the eighth external terminal 27.

As an electrode material forming the eighth electrode 37, there may be used the same electrode material as those forming the first electrode 30 to the eighth electrode 37. Moreover, also the variable capacitance element 91 of the present embodiment example may be produced by using the same production method as in the first embodiment. Furthermore, in the present embodiment example, the eighth electrode 37 has a shape obtained by rotating the seventh electrode 36 through 180 degrees about an axis of the z direction, and therefore, using the same mask as in the seventh electrode 36, the eighth electrode 37 can be formed in a dielectric sheet shape.

Figure 29:
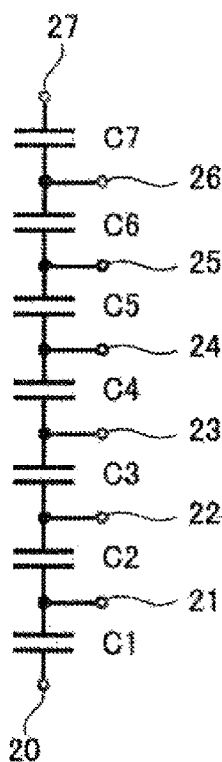
FIG. 29 illustrates an equivalent circuit of the variable capacitance element according to the sixth embodiment of the present disclosure.

FIG. 29 illustrates an equivalent circuit of the variable capacitance element 91 of the present embodiment example. In the variable capacitance element 91 of the present embodiment example, the first electrode body 30a and the second electrode body 31a are laminated in the z direction, thereby forming the first capacitor C1. The second electrode body 31a and the third electrode body 32a are laminated in the z direction, thereby forming the second capacitor C2. The third electrode body 32a and the fourth electrode body 33a are laminated in the z direction, thereby forming the third capacitor C3. The fourth electrode body 33a and the fifth electrode body 34a are laminated in the z direction, thereby forming the fourth capacitor C4. The fifth electrode body 34a and the sixth electrode body 35a are laminated in the z direction, thereby forming the fifth capacitor C5. The sixth electrode body 35a and the seventh electrode body 36a are laminated in the z direction, thereby forming the sixth capacitor C6. The seventh electrode body 36a and the eighth electrode body 37a are laminated in the z direction, thereby forming the seventh capacitor C7. Furthermore, each of the first electrode 30 to the eighth electrode 37 is connected to the corresponding one of external terminals (the first external terminal 20 to the eighth external terminal 27, respectively). Thus, the variable capacitance element 91 of the present embodiment example is configured such that the first capacitor C1 to the seventh capacitor C7 are serially connected in a lamination direction of the electrodes.

Also, in the variable capacitance element 91 of the present embodiment example, the first electrode body 30a to the eighth electrode body 37a have the same shape, and are laminated in such a way that each side as well as each center thereof coincide with each other in the z direction. Therefore, the same effect as in the first embodiment can be obtained.

7. Seventh Embodiment

Figure 30A:
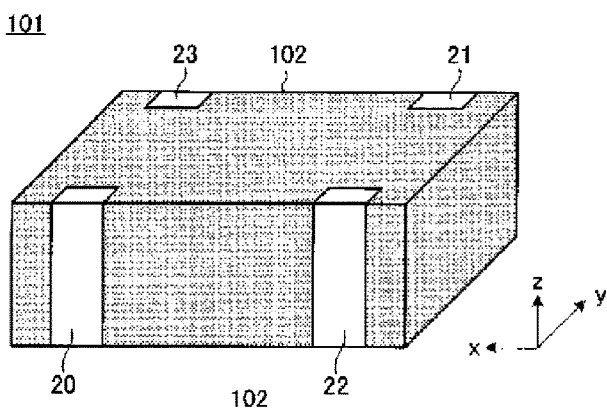
FIG. 30A is a perspective view of a variable capacitance element according to a seventh embodiment of the present disclosure.
Figure 30B:
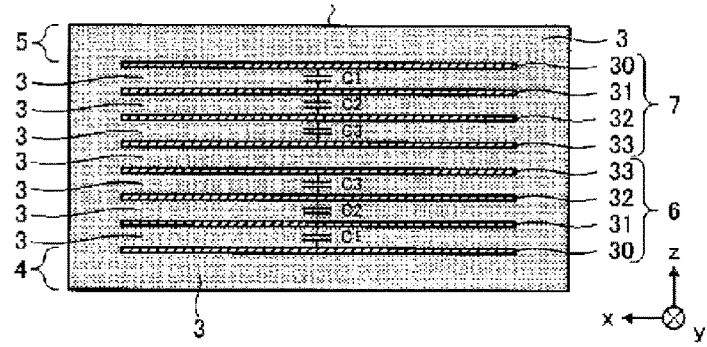
FIG. 30B is a cross-sectional diagram of the variable capacitance element according to the seventh embodiment of the present disclosure.

Next, a variable capacitance element according to a seventh embodiment of the present disclosure will be explained. FIG. 30A is a perspective view of a variable capacitance element 101 of the present embodiment example, and FIG. 30B is a cross-sectional diagram of the variable capacitance element 101 of the present embodiment example. The variable capacitance element 101 of the present embodiment example is an example having a configuration such that two layered products, each comprising the first electrode 30 to the fourth electrode 33, are laminated. In FIG. 30A and FIG. 30B, portions corresponding to portions in FIG. 10A and FIG. 10B are assigned the same reference numerals and letters, and duplicate description thereof will be omitted.

As shown in FIG. 30A, the variable capacitance element 101 of the present embodiment example comprises a variable capacitance element body 102 composed of a rectangular parallelepiped member and four external terminals, that is, the first external terminal 20 to the fourth external terminal 23.

The variable capacitance element body 102 comprises a first layered product 6, a second layered product 7, the lower dielectric layer 4, and the upper dielectric layer 5.

Figure 31:
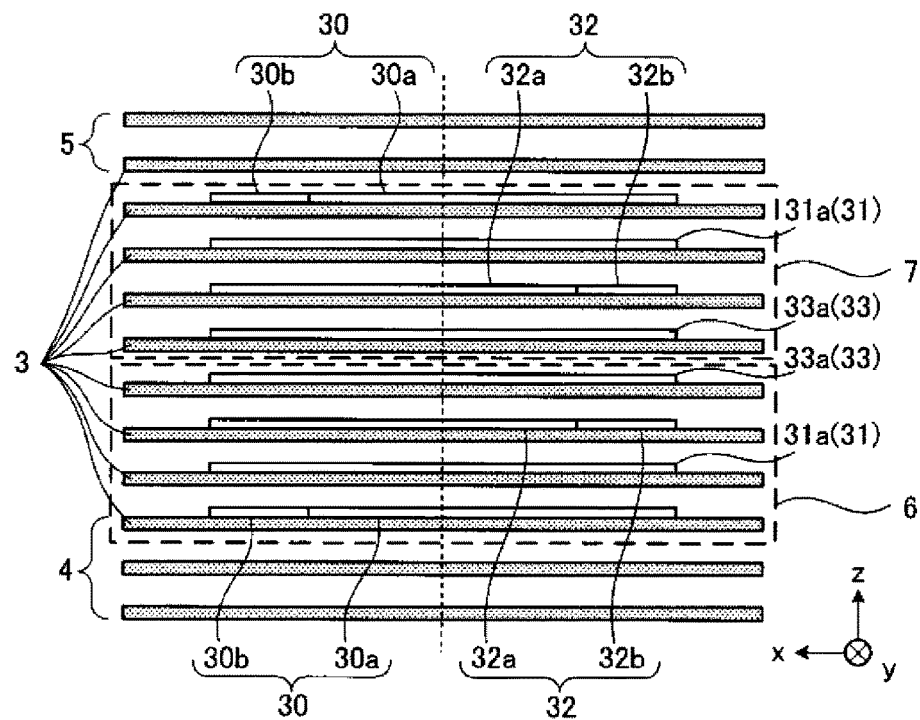
FIG. 31 is an exploded view of a variable capacitance element body according to the seventh embodiment of the present disclosure, the view being taken from one side surface of the variable capacitance element body in a long side direction.

FIG. 31 is an exploded view of the variable capacitance element body 102, the view being taken from one side of the variable capacitance element body 102 in a long side direction. In FIG. 31, each of broken lines indicates a line passing through the centers (the centers of gravity) of the dielectric layer 3 and each of the internal electrodes. As shown in FIG. 31, the first layered product 6 is configured such that the first electrode 30, the second electrode 31, the third electrode 32, and the fourth electrode 33 are laminated in this order from the bottom via the dielectric layer 3. Meanwhile, the second layered product 7 is laminated over the first layered product 6 in the z direction and is configured such that the fourth electrode 33, the third electrode 32, the second electrode 31, and the first electrode 30 are laminated in this order from the bottom via the dielectric layer 3. In other words, the first layered product 6 and the second layered product 7 are configured in such a way that the order of laminating the first electrode 30 to the fourth electrode 33 from the bottom to the top in the first layered product 6 is the reverse of the order thereof in the second layered product 7. Furthermore, the lower dielectric layer 4 is formed under the first layered product 6 whereas the upper dielectric layer 5 is laminated over the second layered product 7.

The two of first electrodes 30, which are formed in the first layered product 6 and the second layered product 7, respectively, are connected to the first external terminal 20, whereas the two of second electrodes 31, which are formed in the first layered product 6 and the second layered product 7, respectively, are connected to the second external terminal 21. Furthermore, the two of third electrodes 32, which are formed in the first layered product 6 and the second layered product 7, respectively, are connected to the third external terminal 22, whereas the two of fourth electrodes 33, which are formed in the first layered product 6 and the second layered product 7, respectively, are connected to the fourth external terminal 23.

Also the variable capacitance element 101 of the present embodiment example may be produced by using the same production method as in the first embodiment.

Figure 32A:
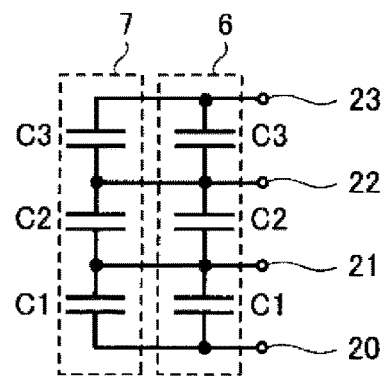
FIG. 32A is a circuit diagram of an interior of the variable capacitance element according to the seventh embodiment of the present disclosure.
Figure 32B:
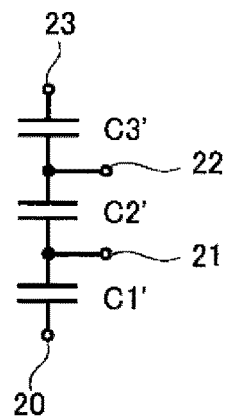
FIG. 32B illustrates an equivalent circuit of the variable capacitance element according to the seventh embodiment of the present disclosure.

FIG. 32A is a circuit diagram of an interior of the variable capacitance element 101 of the present embodiment example, and FIG. 32B illustrates an equivalent circuit of the variable capacitance element 101 of the present embodiment example. In the variable capacitance element 101 of the present embodiment example, the first capacitor C1, the second capacitor C2, and the third capacitor C3 are formed in this order from the bottom to the top in the first layered product 6. On the other hand, in the second layered product 7, the third capacitor C3, the second capacitor C2, and the first capacitor C1 are formed in this order from the bottom to the top. Here, the two of fourth electrodes 33 adjoining each other and formed in a boundary between the first layered product 6 and the second layered product 7 are connected to a same external terminal (the fourth external terminal 23) and are at the same potential, and therefore no capacitor is formed between these two of fourth electrodes 33.

Furthermore, each of the first electrode 30 to the fourth electrode 33 which are formed in the first layered product 6 is connected to the corresponding one of external terminals (the first external terminal 20 to the fourth external terminal 23, respectively). Also, each of the first electrode 30 to the fourth electrode 33 which are formed in the second layered product 7 is also connected to the corresponding one of external terminals (the first external terminal 20 to the fourth external terminal 23, respectively). Thus, as shown in FIG. 32A, the first layered product 6 and the second layered product 7 each are configured such that the first capacitor C1 to the third capacitor C3 are serially connected in a lamination direction of the electrodes.

Meanwhile, the first electrode 30 formed in the first layered product 6 and the first electrode 30 formed in the second layered product 7 each are connected to the common first external terminal 20. The second electrode 31 formed in the first layered product 6 and the second electrode 31 formed in the second layered product 7 each are connected to the common second external terminal 21. The third electrode 32 formed in the first layered product 6 and the third electrode 32 formed in the second layered product 7 each are connected to the common third external terminal 22. The fourth electrode 33 formed in the first layered product 6 and the fourth electrode 33 formed in the second layered product 7 each are connected to the common fourth external terminal 23. Thus, the first capacitor C1 formed in the first layered product 6 and the first capacitor C2 formed in the second layered product 7 are connected in parallel. Likewise, the second capacitor C2 formed in the first layered product 6 and the second capacitor C2 formed in the second layered product 7 are connected in parallel, and the third capacitor C3 formed in the first layered product 6 and the third capacitor C3 formed in the second layered product 7 are connected in parallel.

Therefore, when this variable capacitance element 101 is expressed as an equivalent circuit, as shown in FIG. 32B, the equivalent circuit is such that a capacitor C1' comprising the two of first capacitors C1, a capacitor C2' comprising the two of second capacitors C2, and a capacitor C3' comprising the two of third capacitors C3 are serially connected.

Also, in the variable capacitance element 101 of the present embodiment example, the first electrode body 30a to the fourth electrode body 33a in each of the first layered product 6 and the second layered product 7 have the same shape, and are laminated in such a way that each side as well as each center thereof coincide with each other in the z direction. Therefore, the same effect as in the first embodiment can be obtained. Furthermore, a plurality of layered products, each being obtained by laminating a plurality of electrodes each of which are connected to the corresponding one of external terminals via the dielectric layer 3, are laminated and said layered products are electrically connected in parallel, whereby each of the capacitors has a larger capacity.

8. Eighth Embodiment

Figure 33A:
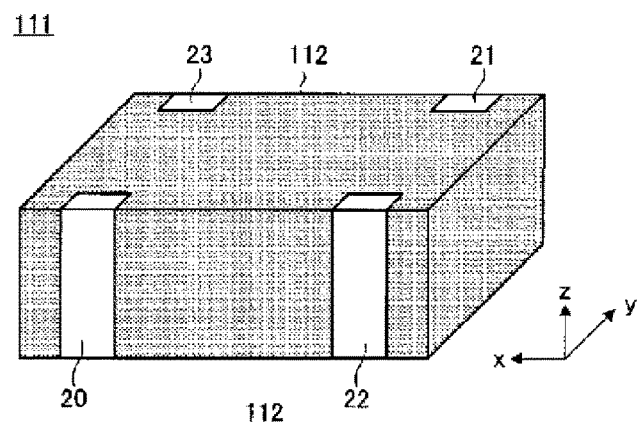
FIG. 33A is a perspective view of a variable capacitance element according to an eighth embodiment of the present disclosure.
Figure 33B:
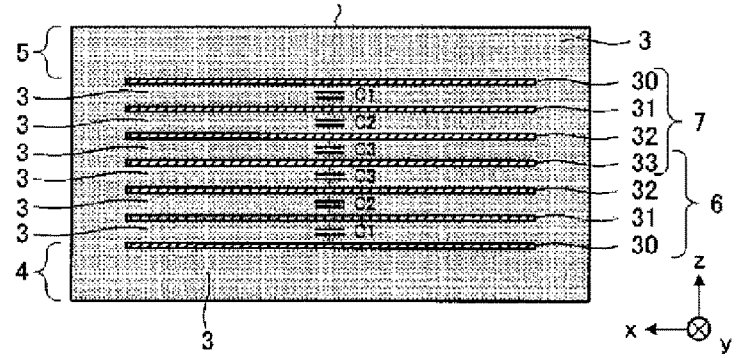
FIG. 33B is a cross-sectional diagram of the variable capacitance element according to the eighth embodiment of the present disclosure.
Figure 34:
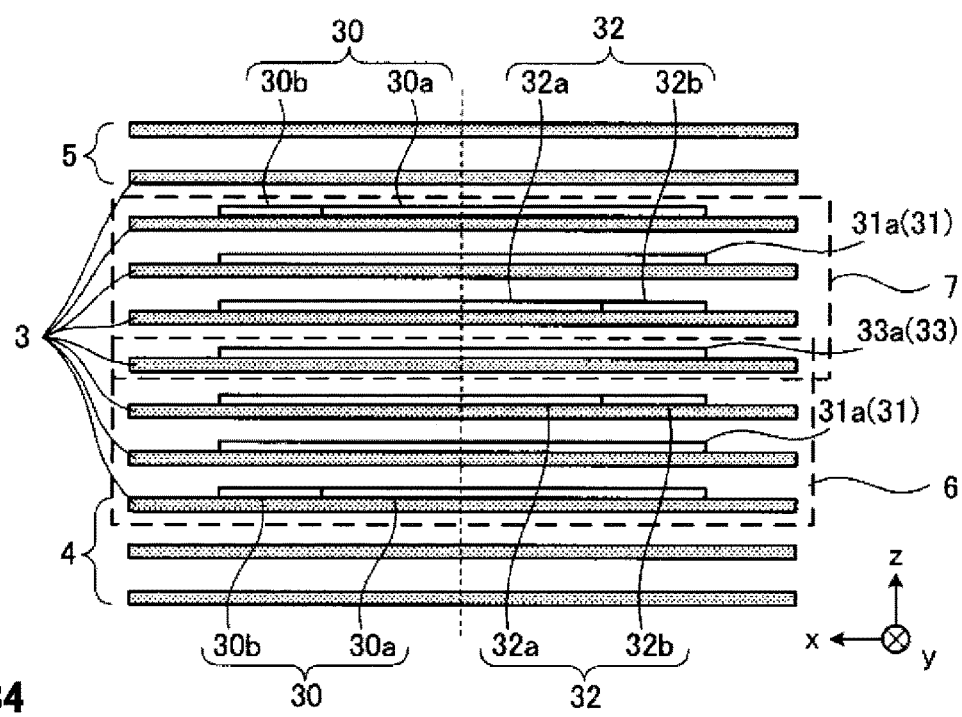
FIG. 34 is an exploded view of a variable capacitance element body according to the eighth embodiment of the present disclosure, the view being taken from one side surface of the variable capacitance element body in a long side direction.

Next, a variable capacitance element according to an eighth embodiment of the present disclosure will be explained. FIG. 33A is a perspective view of a variable capacitance element 111 of the present embodiment example, and FIG. 33B is a cross-sectional diagram of the variable capacitance element 111 of the present embodiment example. FIG. 34 is an exploded view of a variable capacitance element body 112, the view being taken from one side of the variable capacitance element body 112 in a long side direction. The variable capacitance element 111 of the present embodiment example is an example having a configuration such that two layered products, each comprising the first electrode 30 to the fourth electrode 33, are laminated. In FIG. 33 and FIG. 34, portions corresponding to portions in FIG. 30 and FIG. 31 are assigned the same reference numerals and letters, and duplicate description thereof will be omitted.

As shown in FIG. 33A, the variable capacitance element 111 of the present embodiment example comprises a variable capacitance element body 112 composed of a rectangular parallelepiped member and four external terminals, that is, the first external terminal 20 to the fourth external terminal 23.

The variable capacitance element body 112 comprises the first layered product 6, the second layered product 7, the lower dielectric layer 4, and the upper dielectric layer 5. Furthermore, the present embodiment example is configured such that the fourth electrode 33 formed as a top layer of the first layered product 6 also serves as the fourth electrode 33 formed as a bottom layer of the second layered product 7. Also the variable capacitance element 111 of the present embodiment example may be produced by using the same production method as in the first embodiment.

A circuit configuration of the variable capacitance element 111 of the present embodiment example is the same as that of the seventh embodiment shown in FIG. 32A and FIG. 32B. The variable capacitance element 111 of the present embodiment example is configured such that the fourth electrode 33 formed as a top layer of the first layered product 6 also serves as the fourth electrode 33 formed as a bottom layer of the second layered product 7, whereby, compared to the seventh embodiment, the variable capacitance element 111 is reduced the height and thus smaller. In addition, the same effect as in the first embodiment can be obtained.

9. Ninth Embodiment

Figure 35A:
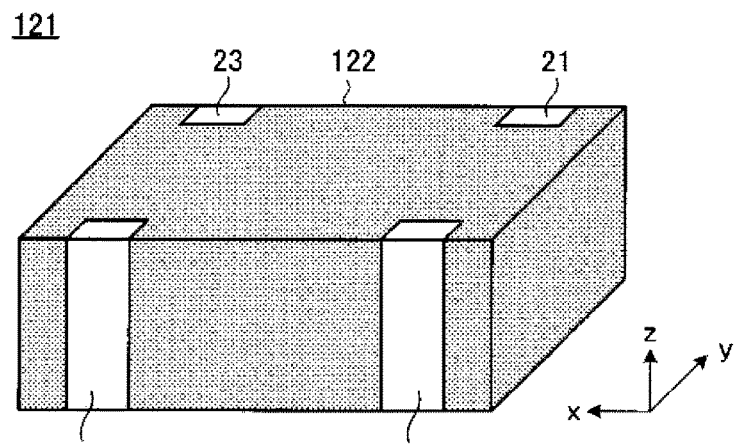
FIG. 35A is a perspective view of a variable capacitance element according to a ninth embodiment of the present disclosure.
Figure 35B:
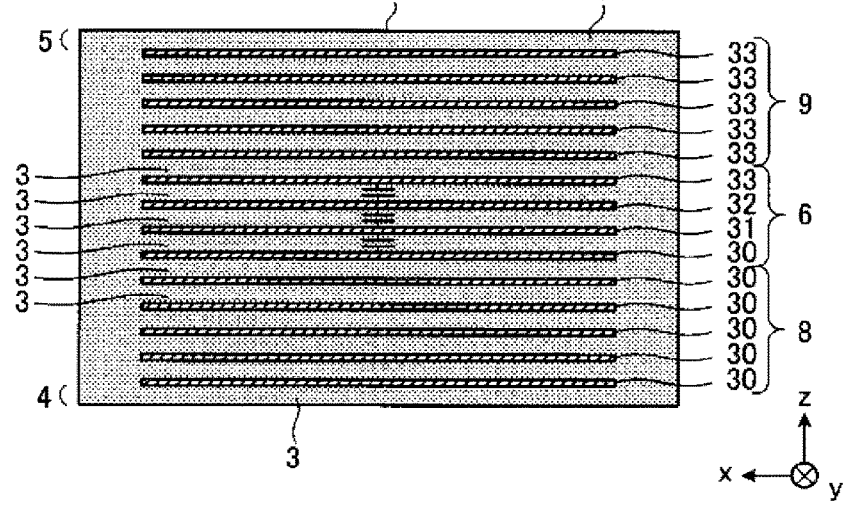
FIG. 35B is a cross-sectional diagram of the variable capacitance element according to the ninth embodiment of the present disclosure.

Next, a variable capacitance element according to a ninth embodiment of the present disclosure will be explained. FIG. 35A is a perspective view of a variable capacitance element 121 of the present embodiment example, and FIG. 35B is a cross-sectional diagram of the variable capacitance element 121 of the present embodiment example. The variable capacitance element 121 of the present embodiment example is an example of a variable capacitance element comprising a stress control unit in a lamination direction of electrodes. In FIG. 35A and FIG. 35B, portions corresponding to portions in FIG. 33A and FIG. 33B are assigned the same reference numerals and letters, and duplicate description thereof will be omitted.

As shown in FIG. 35A, the variable capacitance element 121 of the present embodiment example comprises a variable capacitance element body 122 composed of a rectangular parallelepiped member and four external terminals, that is, the first external terminal 20 to the fourth external terminal 23.

The variable capacitance element body 122 comprises the first layered product 6, a first stress control unit 8, a second stress control unit 9, the lower dielectric layer 4, and the upper dielectric layer 5.

The first stress control unit 8 is formed under the first layered product 6, and comprises a plurality of the first electrodes 30 laminated via the dielectric layer 3. The first electrodes 30 constituting the first stress control unit 8 are connected to the first external terminal 20, as is the case with the first electrode 30 constituting the first layered product 6. Therefore, the first electrode 30 formed as a bottom layer in the first layered product 6 and the first electrode 30 constituting the first stress control unit 8 are at the same potential, and therefore no capacitor is formed between these electrodes. Furthermore, the plurality of first electrodes 30 formed in the first stress control unit 8 are also at the same potential, and therefore no capacitor is formed in the first stress control unit 8.

The second stress control unit 9 is formed above the first layered product 6, and comprises a plurality of the fourth electrodes 33 laminated via the dielectric layer 3. The fourth electrodes 33 constituting the second stress control unit 9 are connected to the fourth external terminal 23, as is the case with the fourth electrode 33 constituting the first layered product 6. Therefore, the fourth electrode 33 formed as a top layer in the first layered product 6 and the fourth electrode 33 constituting the second stress control unit 9 are at the same potential, and therefore no capacitor is formed between these electrodes. Furthermore, the plurality of fourth electrodes 33 formed in the second stress control unit 9 are also at the same potential, and therefore no capacitor is formed in the second stress control unit 9.

In the variable capacitance element 121 of the present embodiment example, the internal electrodes formed in the first stress control unit 8, the first layered product 6, and the second stress control unit 9 have the same shape of the electrode body, and are laminated in such a way that each side as well as each center thereof coincide with each other in the z direction. Also the variable capacitance element 121 of the present embodiment example may be produced by using the same production method as in the first embodiment.

The variable capacitance element 121 of the present embodiment example has an equivalent circuit having a same circuit configuration as that of the equivalent circuit shown in FIG. 13. In other words, in the present embodiment example, capacitors are formed only in the first electrode 30 to the fourth electrode 33 which are formed in the first layered product 6. Therefore, also the variable capacitance element 121 of the present embodiment example has a circuit in which, like the circuit shown in FIG. 13, the first capacitor C1, the second capacitor C2, and the third capacitor C3 are serially connected in this order.

In the variable capacitance element 121 of the present embodiment example, also at the first stress control unit 8 and the second stress control unit 9, residual stress is generated by difference in shrinkage percentage between an electrode material and a dielectric material at the time of baking. Thus, residual stress generated at the first stress control unit 8 and the second stress control unit 9 affects the first capacitor C1 to the third capacitor C3 which are formed in the first layered product 6, and hence, compared with a case of forming no stress control unit, a larger capacitance value and a higher variable rate of capacitance can be achieved.

Also, in the present embodiment example, the internal electrodes formed in the first stress control unit 8, the second stress control unit 9, and the first layered product 6 have the same shape, and are laminated in such a way that each side as well as each center thereof coincide with each other in the z direction. Therefore, the same effect as in the first embodiment can be obtained.

It should be note that, in the first to ninth embodiment examples, in each of the first electrode 30 to the fourth electrode 33, the corresponding connection electrode is formed in such a way as to have a width in the x direction sufficiently smaller than a width in the x direction of the corresponding electrode body, but the width may be suitably changed. For example, an electrode on which only DC voltage is applied may have a high electric resistance in a connection electrode, and therefore may have a smaller width of the connection electrode with respect to an electrode body, but, in an electrode which AC current passes through, from a viewpoint of electric resistance, a connection electrode is preferably formed in such a way as to have a larger width. Moreover, when residual stress is controlled by a stress control unit or multilayered electrodes, a connection electrode in the outermost electrode may have a larger width. Furthermore, examples of a method for reducing electrode resistance of the connection electrode include making the electrode larger in width, shorter in length, and greater in thickness, and by using these in combination, a more preferable method may be applied.

In the above-mentioned first to ninth embodiments, the variable capacitance elements whose capacitance varies depending on applied voltage as capacitance elements were mentioned as examples and explained, but the present disclosure is not limited to these. The configurations explained in the above-mentioned first to ninth embodiments are applicable also to a capacitance element the capacitance of which hardly varies regardless of the type and the level of an input signal (hereinafter, referred to as a constant capacitance element).

However, in this case, a dielectric layer is formed with a paraelectric material having a low relative dielectric constant. Examples of the paraelectric material include paper, polyethylene terephthalate, polypropylene, polyphenylene sulfide, polystyrene, $TiO_2$, $MgTiO_2$, $MgTiO_3$, $SrMgTiO_2$, $Ai_2O_3$, and $Ta_2O_5$. Also such constant capacitance element may be produced in the same way as used for producing the variable capacitance element according to the above-mentioned first embodiment.

Also, the above-mentioned embodiment examples have a configuration in which the center of each of the internal electrodes is arranged on a straight line in a lamination direction thereof, but, the same level of lamination misalignment to be caused at the time of production may be included in the present disclosure. Furthermore, the above-mentioned embodiment examples have the configuration in which the center of each of the internal electrodes coincides with the center of each of the dielectric layer, but, the same level of lamination misalignment to be caused at the time of production may be included in the present disclosure.

Moreover, in the above-mentioned first to ninth embodiments, the internal electrodes have a rectangular shape, but is not limited to this, may have a polygon, circle, or elliptical shape. Furthermore, the capacitance element of the present disclosure may be configured by using the above-mentioned first to ninth embodiments in combination, and various changes can be made within the scope without deviating from the gist of the present invention.

It should be noted that a capacitance C (F) of electrostatic capacitance element suitable for the present disclosure is dependent also on a frequency f (Hz) to be used. The present disclosure is suitable for a capacitance element having a capacitance C (F) with an impedance Z (ohm) ($Z=\frac{1}{2}\pi fc$) of not less than 2 ohms, preferably not less than 15 ohms, more preferably not less than 100 ohms.

10. Tenth Embodiment: Resonance Circuit

Next, a resonance circuit according to a tenth embodiment of the present invention will be explained. The present embodiment example is an example in which a capacitance element of the present invention is applied to a resonance circuit, particularly an example in which the variable capacitance element 1 in the first embodiment is applied thereto. Furthermore, in the present embodiment example, a resonance circuit is used for a noncontact IC card.

Figure 36:
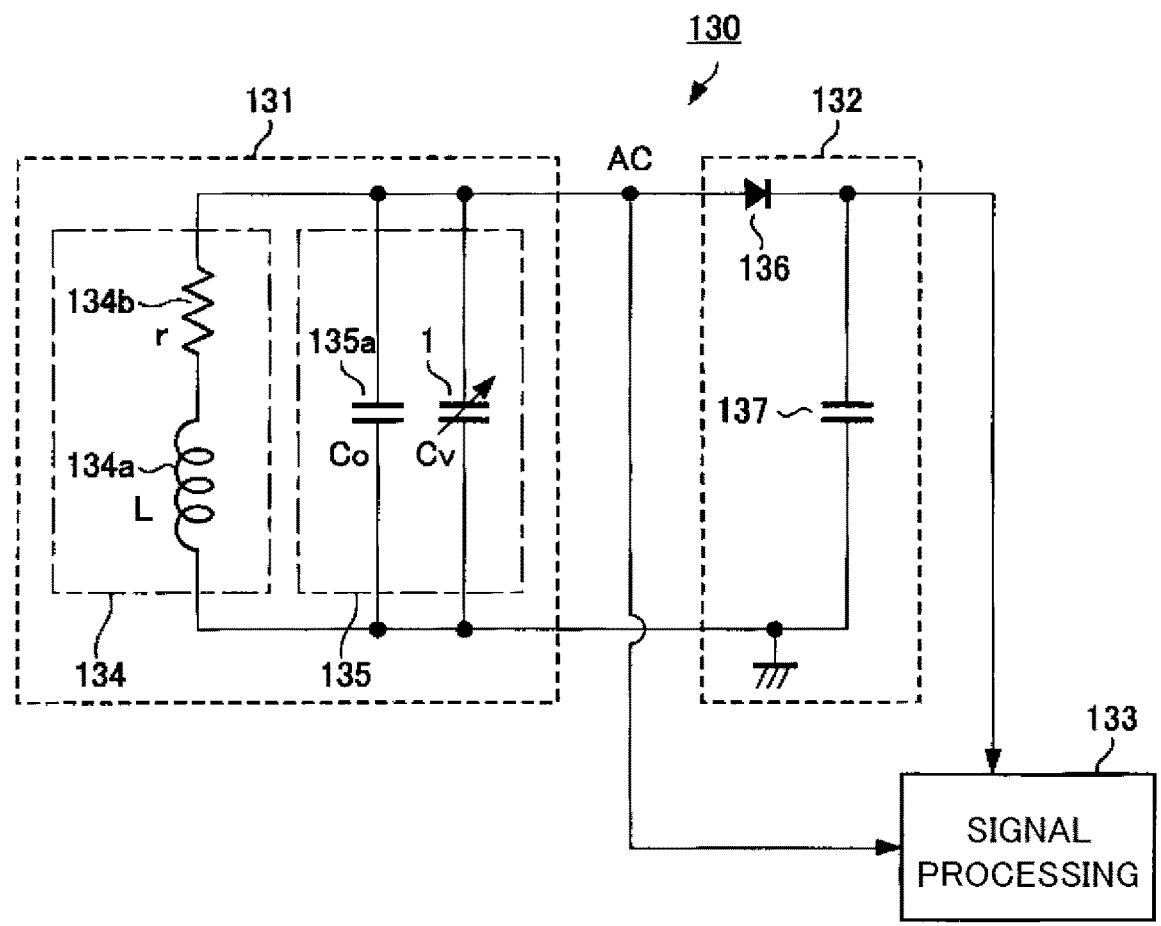
FIG. 36 is a block diagram of a receiving circuit unit of a non-contact IC card using a resonance circuit according to a tenth embodiment of the present disclosure.

FIG. 36 is a block diagram of a receiving circuit unit of a non-contact IC card 130 using a resonance circuit of the present embodiment example. It should be noted that, in the present embodiment example, in order to simplify an explanation thereof, a transmitting (modulating) circuit unit for signals is omitted. The transmitting circuit unit has a same configuration as a prior noncontact IC card or the like has.

As shown in FIG. 36, the noncontact IC card comprises a receiving unit 131 (antenna), a rectifying unit 132, and a signal processing unit 133.

The receiving unit 131 is configured with a resonance circuit comprising a resonance coil 134 and a resonance capacitor 135, and signals transmitted from R/W (not illustrated) of the noncontact IC card 130 are received in the resonance circuit. It should be noted that FIG. 36 illustrates the resonance coil 134 with dividing it into a inductance component 134a (L) and a resistance component 134b (r: approximately several ohms).

The resonance capacitor 135 is configured such that the capacitor 135a having a capacitance Co and the variable capacitance element 1 having a capacitance Cv which varies depending on a voltage value of a received signal (received voltage value) are connected in parallel. In other words, the present embodiment is configured such that a prior antenna (a resonance circuit comprising the resonance coil 134 and the capacitor 135a) and the variable capacitance element 1 are connected in parallel. The present embodiment example is an example using a variable capacitance element shown in FIG. 1 as the variable capacitance element 1.

Like a prior antenna, there is used a capacitor formed by a paraelectric material as the capacitor 135a. The capacitor 135a formed by a paraelectric material has a low relative dielectric constant, and the capacitance of the capacitor 135a hardly varies regardless of the type of input voltage (alternating current or direct current) and the voltage value thereof. Thus, the capacitor 135a has characteristics extremely stable toward input signals. A prior antenna uses such capacitor which is formed by a paraelectric material extremely stable toward input signals, in order to prevent resonance frequency of the antenna from shifting.

It should be noted that, on an actual circuit, capacitance fluctuation of the receiving unit 131 (approximately several pF) is present owing to variation in inductance component L of the resonance coil 134, parasitic capacitance of an input terminal of an integrated circuit in the signal processing unit 133, and the like, and an fluctuation amount thereof varies from an noncontact IC card 130 to another. Therefore, in the present embodiment, in order to control (compensate) these effects, an electrode pattern of the capacitor 135a is trimmed to suitably adjust a capacity Co thereof.

The rectifying unit 132 is configured with a half-wave rectifier circuit comprising a rectifying diode 136, and a rectifying capacitor 137, and rectifies an alternating voltage received in the receiving unit 131 to a direct current voltage, and outputs the direct current voltage.

The signal processing unit 133 is configured mainly with a LSI (Large Scale Integration) of a semiconductor device, and demodulates an alternating current signal received in the receiving unit 131. The LSI in the signal processing unit 133 is driven by the direct current voltage supplied from the rectifying unit 132. It should be noted that, as the LSI, the same type of a noncontact IC card as a prior card may be used.

In the present embodiment example, the centers (centers of gravity) of internal electrodes laminated in the variable capacitance element 1 used for the receiving unit are arranged on a straight line in a lamination direction, and therefore a larger residual stress can be obtained. Thus, electrical characteristics are improved, whereby a larger variable width can be achieved at a lower voltage. Furthermore, since the larger variable width allows a change burden on a resonance capacitor to be reduced, pressure resistance is improved when a dielectric of the resonance capacitor is made to have a greater thickness, and thus a larger AC voltage can be handled.

In the present embodiment example, the variable capacitance element 1 of the first embodiment is used as a variable capacitance element of a resonance circuit, but, the variable capacitance elements of the second to ninth embodiments may be used.

Moreover, in the present disclosure, a configuration mentioned below may be applied.

(1)

An electrostatic capacitance element, comprising:

a capacitance element body, wherein two or more capacitors are formed of a dielectric layer and at least three internal electrodes, the internal electrodes each being laminated via the above-mentioned dielectric layer and arranged to allow a center of gravity of an electrode body forming electrostatic capacitance to be arranged on a straight line in a lamination direction thereof, and said two or more capacitors are serially connected in the lamination direction of the above-mentioned internal electrodes; and an external terminal formed in a side surface of the above-mentioned capacitance element body and electrically connected to the above-mentioned electrode body forming electrostatic capacitance.

(2)

The electrostatic capacitance element according to (1), wherein centers of the above-mentioned internal electrodes are arranged on a straight line passing through a center of gravity of the above-mentioned capacitance element body.

(3)

The electrostatic capacitance element according to (1) or (2), wherein each of the above-mentioned internal electrodes comprises the above-mentioned electrode body and a connection electrode to electrically connect the above-mentioned electrode body to the above-mentioned external terminal, and a plurality of the electrode bodies laminated are formed in such a way as to have a same shape.

(4)

The electrostatic capacitance element according to any of (1) to (3), wherein the above-mentioned capacitance element body comprises a plurality of layered products in the lamination direction, each of the layered products comprising the plurality of internal electrodes constituting the capacitors serially connected in the lamination direction, and the capacitors formed in the respective layered products are connected in parallel.

(5)

The electrostatic capacitance element according to (4), wherein, in between the two layered products adjoining each other, the internal electrode formed as a top layer of one of the layered products also serves as the internal electrode formed as a bottom layer of another of the layered products.

(6)

The electrostatic capacitance element according to any of (1) to (5), comprising a stress control unit above and/or below the above-mentioned serially-connected capacitors, the stress control unit including a plurality of internal electrodes which is laminated via the dielectric layer and in each of which an electrode body forming no capacitor is arranged on a straight line in the lamination direction, wherein a center of gravity of the electrode body forming no capacitor and formed in the stress control unit and a center of the electrode body constituting the capacitor are arranged on a straight line.

(7)

The electrostatic capacitance element according to (6), wherein the internal electrodes of the above-mentioned stress control unit are at the same potential as an internal electrode closest to the stress control unit among the internal electrodes forming a capacitor.

(8)

A resonance circuit, comprising:

a resonance capacitor including an electrostatic capacitance element; and a resonance coil connected to the above-mentioned resonance capacitor, the electrostatic capacitance element, comprising:

a capacitance element body, wherein two or more capacitors are formed of a dielectric layer and at least three internal electrodes, the internal electrodes each being laminated via the above-mentioned dielectric layer and arranged to allow a center of gravity of an electrode body forming electrostatic capacitance to be arranged on a straight line in a lamination direction, and said two or more capacitors are serially connected in a lamination direction of the above-mentioned internal electrodes; and an external terminal formed in a side surface of the above-mentioned capacitance element body and electrically connected to the above-mentioned electrode body forming electrostatic capacitance.

The invention claimed is:

1. An electrostatic capacitance element, comprising:

a capacitance element body, wherein two or more capacitors are formed of at least two dielectric layers and at least three internal electrodes, the at least three internal electrodes each being laminated via the at least two dielectric layers and arranged to allow a center of gravity of an electrode body of each of at least three electrodes forming electrostatic capacitance to be arranged on a straight line in a lamination direction thereof, and said two or more capacitors are serially connected in the lamination direction of the at least three internal electrodes; and at least three external terminals formed in a side surface of the capacitance element body and electrically connected to each electrode body of the at least three internal electrodes forming electrostatic capacitance, wherein the capacitance element body comprises a plurality of layered products in the lamination direction, each of the plurality of layered products comprising the at least three internal electrodes constituting the two or more capacitors serially connected in the lamination direction, and the two or more capacitors formed in the respective layered products are connected in parallel, and wherein between two layered products adjoining each other in the lamination direction of the plurality of layered products, the internal electrode of the at least three internal electrodes formed as a top layer of one of the two layered products also serves as the internal electrode of the at least three internal electrodes formed as a bottom layer of the other one of the two layered products.

2. The electrostatic capacitance element according to claim 1, wherein the center of gravity of each electrode body of the at least three internal electrodes which is arranged on the straight line passes through a center of gravity of the capacitance element body.

3. The electrostatic capacitance element according to claim 2, wherein each of the at least three internal electrodes comprises the electrode body and a connection electrode to electrically connect the electrode body to a respective external terminal of the at least three external terminals, and each electrode body of the at least three internal electrodes to be laminated are formed in such a way as to have a same shape.

4. The electrostatic capacitance element according to claim 1, comprising a stress control unit above and/or below the two or more serially-connected capacitors of one of the plurality of layered products, the stress control unit including a plurality of second internal electrodes which are laminated via a second dielectric layer, and each of the plurality of second internal electrodes includes an electrode body which does not form a capacitor and is arranged on a straight line in the lamination direction, wherein a center of gravity of each electrode body of the stress control unit and the center of gravity of each electrode body of the at least three internal electrodes of each of the plurality of layered products are arranged on the same straight line.

5. The electrostatic capacitance element according to claim 4, wherein the plurality of second internal electrodes of the stress control unit are at a same potential as an internal electrode closest to the stress control unit among each of the at least three internal electrodes of each of the plurality of layered products.

6. A resonance circuit, comprising:

a resonance capacitor including an electrostatic capacitance element; and a resonance coil connected to the resonance capacitor, the electrostatic capacitance element, comprising:

a capacitance element body, wherein two or more capacitors are formed of at least two dielectric layers and at least three internal electrodes, the at least three internal electrodes each being laminated via the at least two dielectric layers and arranged to allow a center of gravity of an electrode body of each of at least three internal electrodes forming electrostatic capacitance to be arranged on a straight line in a lamination direction thereof, and said two or more capacitors are serially connected in the lamination direction of the at least three internal electrodes;

at least three external electrodes; and at least three external terminals formed in a side surface of the capacitance element body and electrically connected to each electrode body of the at least three internal electrodes forming electrostatic capacitance, wherein the capacitance element body comprises a plurality of layered products in the lamination direction, each of the plurality of layered products comprising the at least three internal electrodes constituting the two or more capacitors serially connected in the lamination direction, and the two or more capacitors formed in the respective layered products are connected in parallel, wherein, between two layered products adjoining each other in the lamination direction of the plurality of layered products, the internal electrode of the at least three internal electrodes formed as a top layer of one of the two layered products also serves as the internal electrode of the at least three internal electrodes formed as a bottom layer of the other one of the two layered products.

* * * * *